(12) United States Patent
Makinson et al.

(10) Patent No.: US 6,885,185 B1
(45) Date of Patent: Apr. 26, 2005

(54) MODULAR METER CONFIGURATION AND METHODOLOGY

(75) Inventors: David N. Makinson, Seneca, SC (US); Ludlow Philpot, Fairplay, SC (US)

(73) Assignee: Itron Electricity Metering, Inc., West Union, SC (US)

( * ) Notice: Subject to any disclaimer, the term of this patent is extended or adjusted under 35 U.S.C. 154(b) by 0 days.

(21) Appl. No.: 09/450,890

(22) Filed: Nov. 29, 1999

Related U.S. Application Data

(60) Provisional application No. 60/110,457, filed on Dec. 1, 1998.

(51) Int. Cl.[7] .............................................. G01R 11/32
(52) U.S. Cl. ...................................................... 324/142
(58) Field of Search ............................ 324/103 R, 142, 324/156–157; 702/60–62; 340/870.01, 870.02, 870.03; 361/664–665, 668

(56) References Cited

U.S. PATENT DOCUMENTS

| | | |
|---|---|---|
| 3,268,884 A | 8/1966 | Yanis et al. |
| 3,943,498 A | 3/1976 | McClelland, III et al. |
| 3,964,020 A | 6/1976 | Dickerson |

(Continued)

OTHER PUBLICATIONS

*Semiconductor Physics & Devices: Basic Principles*, 2nd Edition, Neamen, D. Irwin–McGraw Hill, Boston pp. 156–159, 1997.

*Electronic Metering and Applications into the 90's*, Steklac, I. Canadian Electrical Association, Toronto, pp. 3–6, Presented May 1991.

*Primary Examiner*—Vinh P. Nguyen
(74) *Attorney, Agent, or Firm*—Dority & Manning

(57) ABSTRACT

A modular electricity meter configuration and corresponding methodology permits use of certain common components in combination with either a variety of mechanical displays or electronic displays. In electricity meter arrangements making use of printed circuit board or solid state technology, at least two separate electronics boards may be provided. One may constitute a standard board for basic metrology functions while the other may comprise selected implementation of various higher level functions for creating a custom design electricity meter to meet customer requirements. Different customers may be provided with differently outfitted meters by corresponding customization of the higher level function board. A unitary power supply may be provided for both boards through a fixed connector. A common baseplate includes a circuitry link through a nonremovable plug or clip for alternatively providing a tamper proof embodiment or one with exposed terminals for permitting customer testing. Physical stability and strength is provided by using tapered mounting posts and integrated snap fit arrangements without requiring any screws for assembly. A light pipe provides external output through an innercover to indicate correct meter operation. Meter data and other metered information may be output through different configurations optionally involving hardwired output, RF links, pulse outputs, and telephone connections via modem or wireless.

58 Claims, 11 Drawing Sheets

| | | | | | | |
|---|---|---|---|---|---|---|
| 4,056,775 A | 11/1977 | Milkovic | | 4,977,515 A | 12/1990 | Rudden et al. |
| 4,121,147 A | 10/1978 | Becker | | 4,979,122 A | 12/1990 | Davis et al. |
| 4,298,839 A | 11/1981 | Johnston | | 5,001,420 A * | 3/1991 | Germer et al. ............... 324/142 |
| 4,368,424 A * | 1/1983 | Miller ........................ 324/142 | | 5,014,213 A | 5/1991 | Edwards et al. |
| 4,415,853 A | 11/1983 | Fisher | | 5,027,059 A | 6/1991 | de Montgolfier et al. |
| 4,465,970 A | 8/1984 | DiMassimo et al. | | 5,059,896 A | 10/1991 | Germer et al. |
| 4,467,434 A | 8/1984 | Hurley et al. | | 5,089,771 A | 2/1992 | Tanguay et al. |
| 4,491,789 A | 1/1985 | Benbow | | 5,170,051 A | 12/1992 | Pistouley |
| 4,491,790 A | 1/1985 | Miller | | 5,214,587 A | 5/1993 | Green |
| 4,491,792 A | 1/1985 | Bullock et al. | | 5,338,996 A | 8/1994 | Yamamoto |
| 4,509,128 A | 4/1985 | Coppola et al. | | 5,364,290 A | 11/1994 | Hartman |
| 4,646,003 A | 2/1987 | Phillips et al. | | 5,442,281 A | 8/1995 | Frisch et al. |
| 4,697,182 A | 9/1987 | Swanson | | 5,469,049 A | 11/1995 | Briese et al. |
| 4,734,639 A | 3/1988 | Saletta et al. | | 5,495,238 A | 2/1996 | Baker et al. |
| 4,742,296 A | 5/1988 | Petr et al. | | 5,519,387 A | 5/1996 | Besier et al. |
| 4,771,185 A | 9/1988 | Feron et al. | | 5,523,677 A | 6/1996 | Kawakami et al. |
| 4,783,623 A | 11/1988 | Edwards et al. | | 5,590,179 A | 12/1996 | Shincovich et al. |
| 4,794,327 A | 12/1988 | Fernandes | | 5,694,103 A | 12/1997 | Goodwin et al. |
| 4,803,484 A | 2/1989 | Schutrum et al. | | 5,789,672 A | 8/1998 | Rogers et al. |
| 4,804,957 A * | 2/1989 | Selph .................... 340/870.03 | | 5,877,703 A * | 3/1999 | Bloss et al. ............ 340/870.02 |
| 4,881,070 A | 11/1989 | Burrowes et al. | | 5,966,010 A | 10/1999 | Loy et al. |
| 4,884,021 A | 11/1989 | Hammond et al. | | 6,476,595 B1 | 11/2002 | Heuell et al. |
| 4,904,995 A | 2/1990 | Bonner et al. | | | | |
| 4,922,187 A | 5/1990 | Beverly, II | | * cited by examiner | | |

MODULAR METER CONFIGURATION AND METHODOLOGY

PRIORITY CLAIM

Priority is hereby claimed to previous filed U.S. provisional application with the same title and inventors as present, assigned U.S. Ser. No. 60/110,457, filed Dec. 1, 1998.

BACKGROUND OF THE INVENTION

The present invention generally concerns improved configurations and corresponding methodologies for modular meters and related features, and more particularly concerns integrated production of electricity meters capable of assuming a wide variety of optional and alternative features in respective embodiments based on certain common, base features. The subject invention concerns both apparatuses and methodologies in such areas, including in some instances the use of practical computer software applications involving an algorithmic approach to producing a useful, concrete and tangible result, i.e., namely, specific basic and selected higher level metrology functions.

The general object of metrology (i.e., the science of measurement) is to monitor one or more selected physical phenomena to permit a record of the monitored event(s). Such basic purpose of metrology can be applied to a variety of metering devices used in a number of contexts. One broad area of measurement relates, for example, to utility meters. Such role may include the monitoring of the consumption of a variety of forms of energy or other commodities, for example, including electricity, water, gas, and oil.

More particularly concerning electricity meters, a mechanical form of register was historically used for outputting accumulated electricity consumption data. Such an approach provided a relatively dependable field device, especially for the basic or relatively lower level task of simply monitoring accumulated kilowatt hour consumption.

The foregoing basic mechanical form of register is typically limited in its mode of output, so that only a very basic or lower level metrology function is achieved. Subsequently, electronic forms of metrology devices began to be introduced, to permit relatively higher levels of monitoring, involving different forms and modes of data.

In the context of electricity meters specifically, for a variety of management and billing purposes, it became desirable to obtain usage data beyond the basic kilowatt hour consumption readings available with many electricity meters. For example, additional desired data may include rate of electricity consumption, or date and time of consumption. Solid state devices provided on printed circuit boards, for example, utilizing programmable integrated circuit components, have provided effective tools for implementing many of the higher level monitoring functions desired in the electricity meter context.

In addition to the beneficial introduction of electronic forms of metrology, a variety of electronic registers have been introduced with certain advantages. Still further, other forms of data output have been introduced and are beneficial for certain applications, including wired transmissions, data output via radio frequency transmission, pulse output of data, and telephone line connection via modems or cellular linkups.

The advent of such variety and alternatives has required utility companies (the customers of manufacturers) to make choices about which technologies to utilize. Such choices have been made based on both philosophical points (i.e., customer preferences) and based on practical points (such as, training and familiarity of field personnel with specific designs).

Another aspect of the progression of technology in this area of metrology is that various retrofit arrangements have been instituted. For example, some attempts have been made to provide basic metering devices with selected more advanced features without having to completely change or replace the basic meter in the field. For example, attempts have been made to outfit a basically mechanical metering device with electronic output of data, such as for facilitating radio telemetry linkages.

Another aspect of the electricity meter industry is that utility companies have large scale requirements, sometimes involving literally hundreds of thousands of individual meter installations. Implementing incremental changes in technology, such as retrofittable features, or changes to basic components making various components not interchangeable with other configurations already in the field, can generate considerable industry problems. As a result, some utilities have made individual decisions to forego various aspects of potentially improved technologies in order to avoid the above-referenced entanglements and potential negative consequences. In other words, implementing new devices compatible with those already in the field (and typically involving relatively older technologies) minimizes the training and performance requirements of perhaps hundreds of field personnel, and helps avoid field compatibility problems with technology.

From the perspectives of manufacturers in the industry, it can be difficult to implement relatively newer technologies, even after they have clearly been proven, simply due to the large scale inertia of the total system being potentially affected.

While various aspects and alternative features are known in the metering field, no one design has emerged generally integrating customer options based on modular meter configurations and corresponding methodologies.

U.S. Pat. No. 5,495,238 discloses a utility meter making use of a light pipe through the case so that a light source from outside of the meter case may be piped into the meter for interaction with a rotating disc, so that information may be derived from returning light picked up by a pair of light detectors also outside the case. Such '238 patent also represents an example of rotating disc technology as part of the mechanism for monitoring kilowatt hour consumption.

Various examples of multi-function watt-hour meters are provided by U.S. Pat. Nos. 4,881,070; 4,465,970 and 5,014,213. U.S. Pat. No. 4,881,070 discloses a device included within the meter for reading dials and for producing output signals for transmitting such readings and others to a remote location. The disclosure of U.S. Pat. No. 4,803,484 is also related to such subject matter.

Remote meter reading and transmission of other information from electric meters such as over an electric power distribution grid or network to a main location is discussed in U.S. Pat. No. 4,904,995. Components disclosed in U.S. Pat. No. 4,491,789 connect a pulse initiator within an energy meter enclosure for responding to rotation of a meter disc. An apparatus for transmitting data from a meter to a remote location across telephone lines and utilizing a shaft angle encoder arrangement is disclosed by U.S. Pat. No. 3,268,884.

Examples of enhancing the functions of an electromechanical watt-hour meter without incorporating addi tional apparatus within the meter are shown by U.S. Pat. Nos. 4,415,853; 4,922,187 and 4,646,003. An arrangement is disclosed in U.S. Pat. No. 4,922,187 for providing a pulse initiator circuit attachable to a utility meter without breaking the meter seal. Another pulse initiator form is included in U.S. Pat. No. 3,943,498. U.S. Pat. No. 4,121,147 discloses a form of an adaptor which may be used as a housing for the pulse-pickup electronics along with whatever other additional circuits may be needed for manipulating resulting pulse data for performance of functions to obtain desired features.

U.S. Pat. No. 5,364,290 shows various electricity meter features, including use of particular molded base features with pairs of current spades projecting through and anchored to such base.

U.S. Pat. No. 4,783,623 is a further example of meter technology. U.S. Pat. No. 5,089,771 is an example of a watt-hour meter reading device with a rotating disc and multiple dial register mechanism.

A laminated "figure 8" power meter core example is disclosed in U.S. Pat. No. 5,694,103. U.S. Pat. No. 4,742,296 shows a further example of three legged or "figure 8" ferromagnetic meter cores. Additional background references on such area include U.S. Pat. Nos. 4,491,790; 5,027,059; 5,338,996 and 5,523,677.

U.S. Pat. No. 4,509,128 sets forth an example of solid state electrical power demand register apparatus and methodology. U.S. Pat. No. 5,469,049 also discloses an example of solid state technology, including a self-diagnostic electronic metering device. Background references related to such subject matter include, for example, U.S. Pat. Nos. 3,964,020; 4,056,775; 4,697,182; 4,734,639; 4,771,185; 4,884,021; 4,977,515; 4,979,122 and 5,059,896.

U.S. Pat. No. 4,783,623 discloses an example of a rotating disc type meter and a corresponding device for use therewith for recording energy use.

Additional exemplary background references in the area of electric meters generally include U.S. Pat. Nos. 5,170,051; 5,214,587; 5,442,281; 5,519,387; 5,590,179 and 5,789,672.

The disclosures of all of the foregoing United States patents are hereby fully incorporated into this application by reference thereto.

SUMMARY OF THE INVENTION

The present invention recognizes and addresses various of the foregoing shortcomings, and others concerning metrology devices and methodologies. Thus, broadly speaking, a principal object of this invention is improved meter configurations and corresponding methodologies. More particularly, a main concern is improved electricity meter configurations and corresponding methodologies.

Another general object of the present invention is to provide a meter configuration which is at least partially modular. In such context, it is a more particular object to provide such an improved configuration and corresponding methodology which permits use of a basic configuration with alternatively either a form of mechanical display arrangement or an electronic display, pursuant to customer preferences and/or requirements. Further in such context, it is an object to permit use of various constructions of such mechanical displays and electronic displays with modular meter configurations in accordance with the subject invention.

Yet another general object of the present invention is to provide improved meter configurations and corresponding methodologies which advantageously permit use of separate printed circuit boards, one for standard or basic features and another for customized, more advanced functions. In accordance with such aspect of the present invention, it is a more particular object to permit customization of the higher level of functionality (or "personality") of meter configurations in accordance with the invention. Such advantages further result in improved delivery of manufactured devices to utility company customers, both with respect to cost efficiency and timeliness.

In such context of providing separate printed circuit boards (two or more of such boards in a given embodiment), it is a general object to achieve a unitary power supply for all such boards. In such context, it is a more particular object to permit interconnections between such boards through use of a fixed connector, for improved physical stability and electric connectivity.

It is another more particular object to provide a meter configuration for various embodiments, using a common baseplate having an initial main circuit opening to permit access for calibration, and which may be completed with a nonremovable plug or clip. In such context, it is a further particular object to provide alternative such clips, to permit the given meter embodiment to be rendered tamper proof or alternatively to be provided with exposed terminals to further permit customer accuracy testing and/or "internal" sensing after manufacture.

It is another present object to provide improved metering devices making use of printed circuit board technology having 100 percent surface mounted features on a single side of such boards, so that no components with wires must be passed through holes formed in the circuit board. With such arrangements, improved simplicity and cost efficiency are achieved.

In the context of improved modular meter configurations and corresponding methodologies, another present objective is to provide improved stability of design, including both the mechanical strength of various components and the quality of electrical connections between electrically conductive components. It is a more particular object to provide such improved modular designs which simultaneously contribute to the proper alignment of internal components for quality metering operations, without requiring older technologies such as wedging or potting.

It is another present object to provide improved communications through meter casings, such as by providing a light pipe operative with an internal source, such as for verifying calibration and correct operation.

Another present object is improved data transmission features, for example, by avoiding the use of any metal in faceplates or cover elements, to permit meter data to be radiated directly from a printed circuit board without requiring a separate antenna.

The use of improved display control buttons and corresponding actuators, integrally connected or operatively associated with a faceplate, are additional present objectives.

Still a further general object is to provide a modular meter configuration which makes use of mounting posts and snap fit technology for arranging and securing the components thereof, without requiring any screws or equivalent individual fasteners or securing elements.

Another general objective is to provide improved modular meter configurations and corresponding methodologies which permit the selective use of different forms of data outputs, including wired transmissions, radio frequency transmissions, pulse outputs (such as optically implemented and others), and telephone line transmissions via modem or wireless.

In the context of all of the foregoing alternative features, it is a present general object to provide an improved modular meter configuration and methodology which better facilitates efficient production of custom design utility meters, especially electricity meters, having the inherent advantages of an integrated system without disadvantages of retrofit techniques.

Additional objects and advantages of the invention are set forth in, or will be apparent to those of ordinary skill in the art from, the detailed description herein. Also, it should be further appreciated by those of ordinary skill in the art that modifications and variations to the specifically illustrated, referred and discussed features and steps hereof may be practiced in various embodiments and uses of this invention without departing from the spirit and scope thereof, by virtue of present reference thereto. Such variations may include, but are not limited to, substitution of equivalent means and features, materials, or steps for those shown, referenced, or discussed, and the functional, operational, or positional reversal of various parts, features, steps, or the like.

Still further, it is to be understood that different embodiments, as well as different presently preferred embodiments, of this invention may include various combinations or configurations of presently disclosed features, steps, or elements, or their equivalents (including combinations of features or steps or configurations thereof not expressly shown in the figures or stated in the detailed description). One exemplary embodiment of the present invention relates to an improved modular meter configuration for connecting to either a form of mechanical display or an electronic display. Such electronic display may be mounted with an internally secured display holder. Such embodiment may further include a separate metrology board and a higher level function board. Such metrology board may be a standard or basic device for kilowatt hour data while the higher level function board may permit custom design or "personality" inclusion of features for an electricity meter per a given customer's design criteria. For example, a standard device for kilowatt hour sensing may include a transducer with three inputs (current, voltage, and phase) and a simple pulse train output.

Yet another exemplary embodiment of the present invention involves a modular meter configuration having separate function boards, wherein the respective boards are driven by a unitary or singular, common power supply.

Yet another construction comprising an improved meter configuration and corresponding methodology in accordance with the subject invention makes use of tapered mounting posts and various snap fit features for providing a stable meter construction without requiring screws or other individual fastener elements.

Still further exemplary embodiments involve various combinations of the foregoing features, further including light pipe features for transmission of an optical source from inside a meter case to the outside thereof, such as for verifying calibration and/or proper operation. In such embodiments and others, further features may be provided in different combinations concerning various alternative display control buttons and/or optical communication ports, for example, for control of internally housed functional features.

Still further embodiments of the present invention involve various of the foregoing configurations, further outfitted, in the alternative, for different forms of outputting the basic and/or higher level data obtained with the metering device. Such embodiments may include various configurations of hardwired output, radio frequency transmitted output, pulse outputs (such as optically linked or others), and telephone line outputs via modem or wireless.

Additional embodiments of the subject invention, not necessarily expressed in this summarized section, may include and incorporate various mixtures and combinations of aspects of features referenced in the summarized objectives above, and/or other features as otherwise discussed in this application.

The present invention equally concerns various exemplary corresponding methodologies for practice and manufacture of all of the herein referenced meter embodiments.

Those of ordinary skill in the art will better appreciate the features and aspects of such embodiments, including methodologies, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
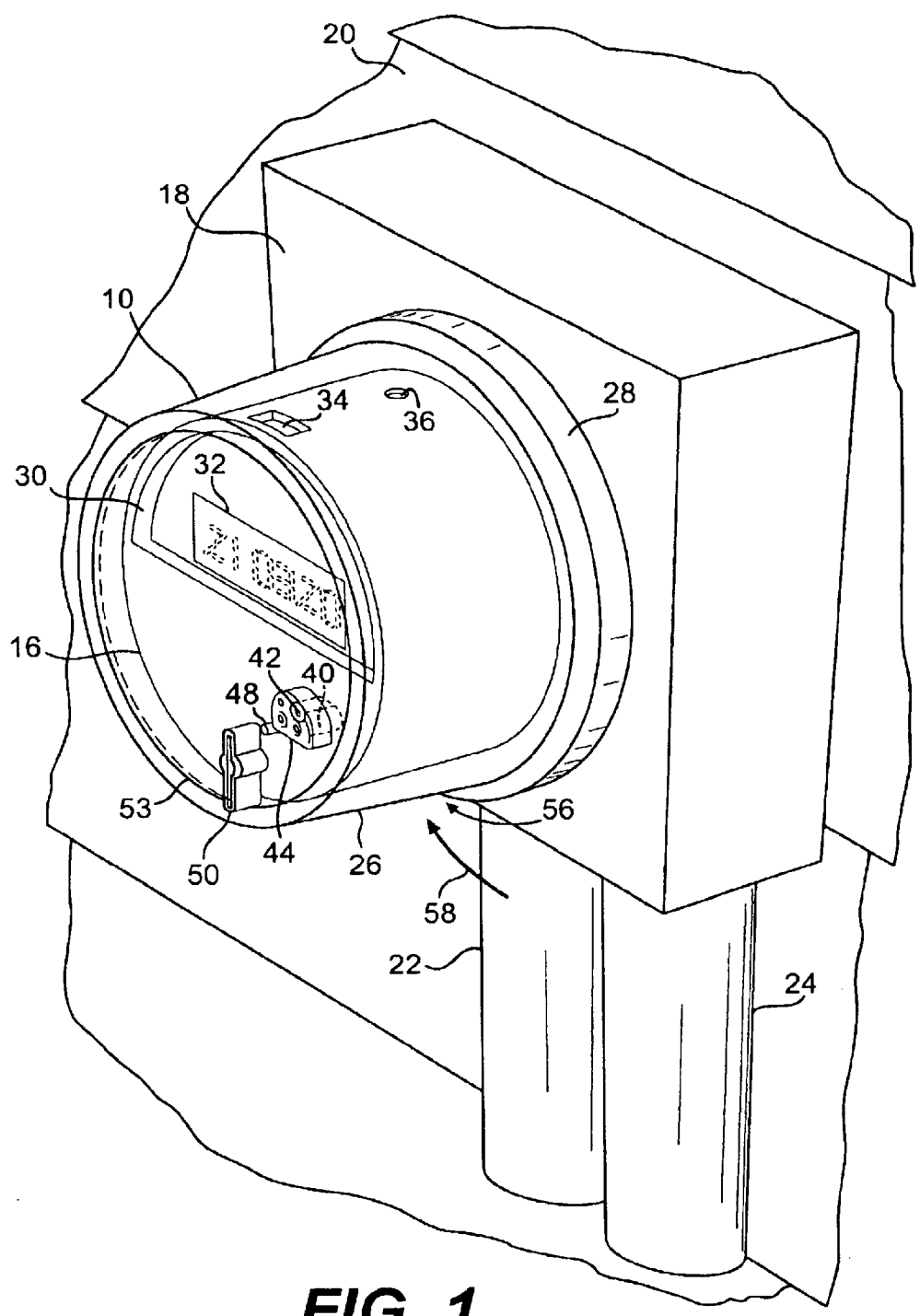
FIG. 1 is a generally front and partially side perspective view of an exemplary embodiment of the subject invention as configured during use thereof, including enclosure within an external or outer cover.

Repeat use of reference characters throughout the present specification and appended drawings is intended to represent same or analogous features, elements, or steps of the subject invention.

DETAILED DESCRIPTION OF THE PREFERRED EMBODIMENTS

Those of ordinary skill in the art will appreciate the various modifications and variations which may be made to the specific examples and embodiments discussed herein, and corresponding methodologies. Therefore, the description of such specific examples is intended by way of example only, rather than limitation such that the above-referenced variations come within the spirit and scope of various uses of the invention.

Further referencing present exemplary embodiments, it is to be understood that certain figures may illustrate various aspects and features of one embodiment such as may be included in another embodiment. Therefore, one or more figures may be required for illustration of all features included within a given embodiment of the subject invention.

Figure 2:
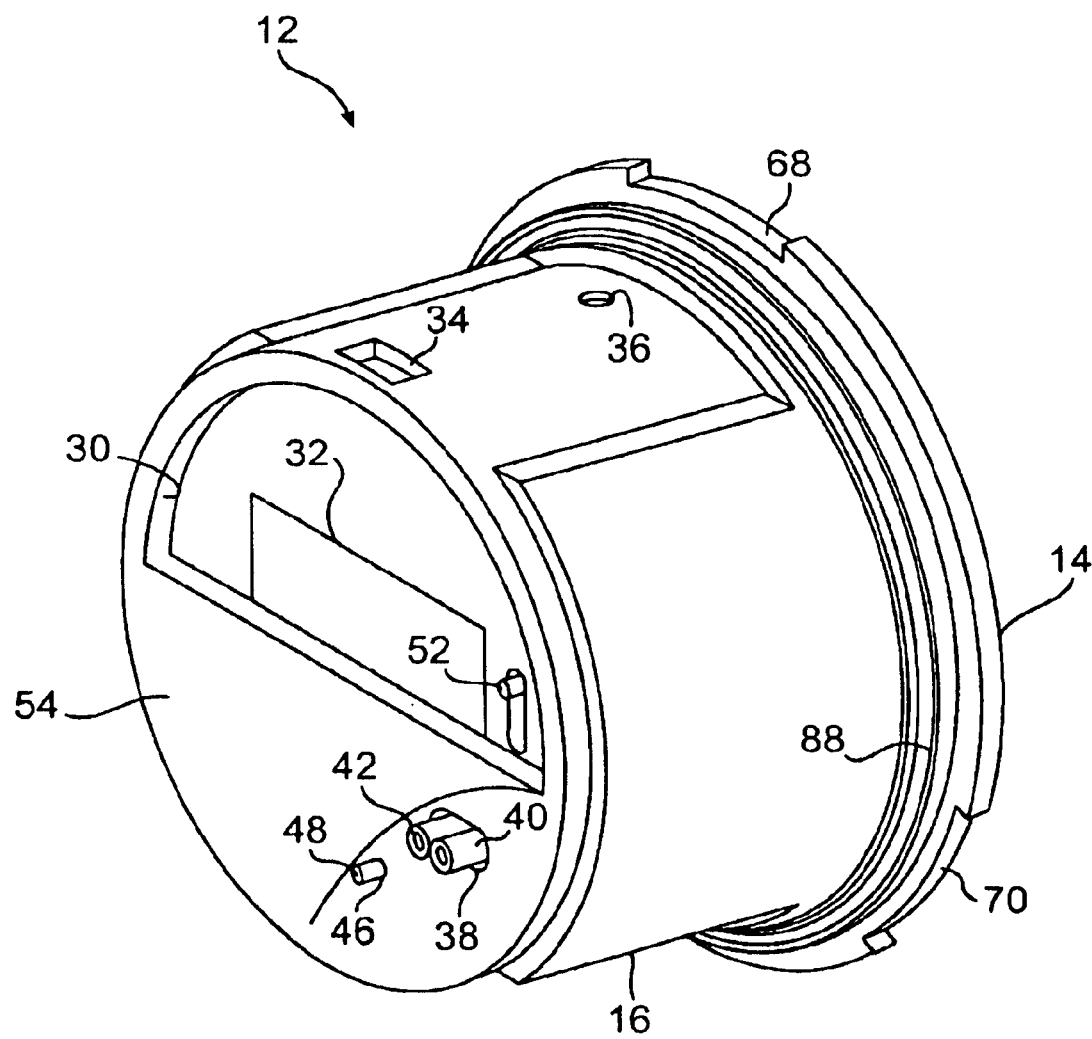
FIG. 2 is a generally front and partially side perspective view, similar to that of FIG. 1, of an exemplary embodiment in accordance with the subject invention in isolation from the outer cover thereof, and in isolation from a use configuration thereof.
Figure 3:
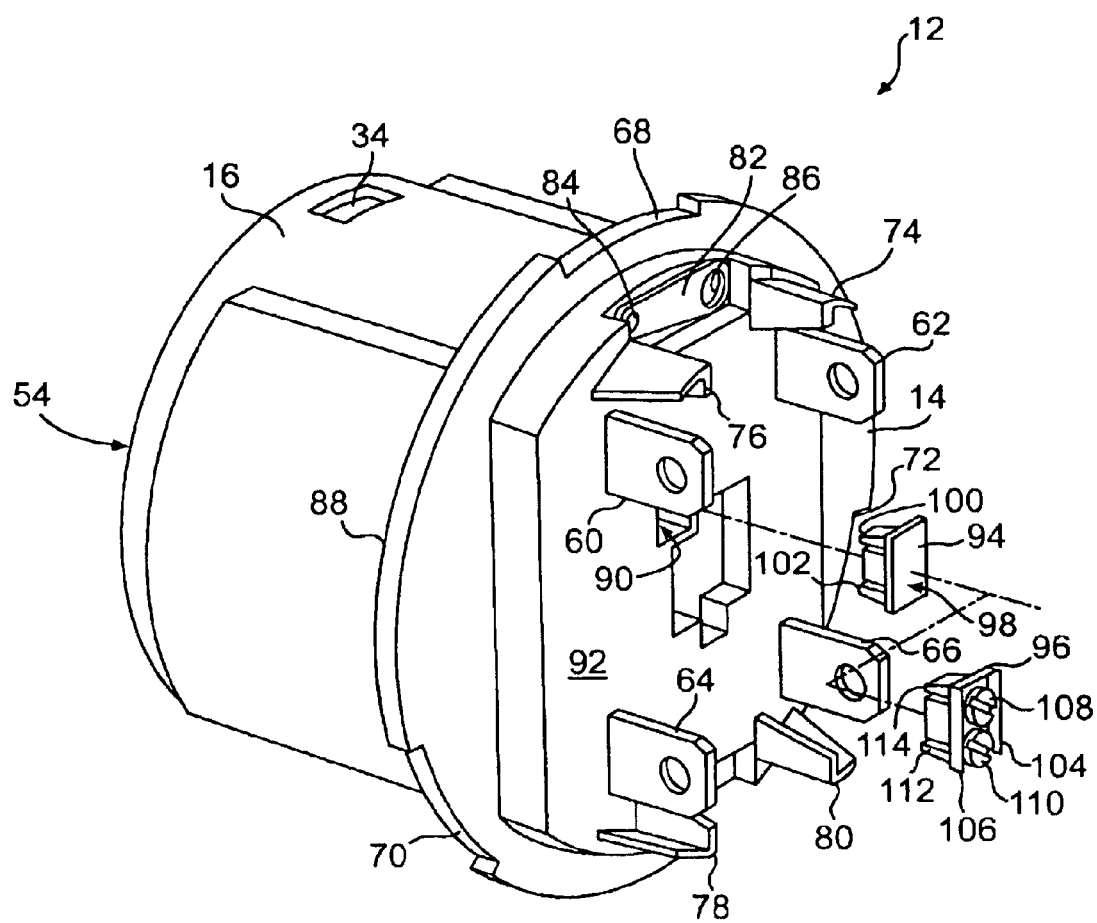
FIG. 3 is a generally rear and partially side perspective view of the illustration of an exemplary a embodiment as in FIG. 2, and showing in exploded view alternative modular plug features thereof.

FIGS. 1 through 3 collectively represent generally external features of an exemplary embodiment in accordance with the subject invention. In such regard, FIG. 1 provides a generally front perspective and partially side view of a complete device in accordance with the subject invention, provided with an external cover generally 10 and situated for use thereof in a typical arrangement, such as in a residential electric meter setting. FIGS. 2 and 3 provide generally front and rear perspective views, respectively, and with partial side views, of the subject exemplary embodiment in accordance with the subject invention, but with outer or external cover 10 thereof removed, and isolated from any use environment.

Referring more particularly (and collectively) to present FIGS. 1 through 3, inclusive, an exemplary meter configuration generally 12 is provided in accordance with the subject invention. Apparatus 12 may preferably include a baseplate or molded base generally 14 which receives what may be regarded as an inner cover generally 16. Such inner cover 16 features are generally shown in dotted line in present FIG. 1, representing the fact that they are received within the outer or exterior cover 10.

FIG. 1 illustrates an exemplary typical installation, with an embodiment of the subject invention received within outer cover 10 and mounted to a meter receiving junction box generally 18. As well known to those of ordinary skill in the art, such box 16 is typically mounted on a wall 20 or similar flat surface. Electric wires are provided in and out of box 18, typically covered with protective pipes or enclosures generally 22 and 24.

More specifically, outer cover 10 may be provided with a truncated, generally frusto-conical section generally 26 and integrally included therewith or associated therewith a relatively larger base section 28 for being received about the peripheral protrusions of baseplate 14. Outer cover 10 may be secured to meter device 12 with both cover 10 and device 12 captured by box 18, all in various ways, as well known to those of ordinary skill in the art, and not forming any particular aspects of the present invention.

As further known and understood by those of ordinary skill in the art, outer cover 10 is typically transparent. Outer cover 10 may be comprised of glass or various generally transparent plastic materials. Such an external cover 10 provides adequate safety for the ultimate consumers (i.e., the customers of a utility company) as well as the field personnel of the utility company. At the same time, the transparent aspect of such outer cover 10 and several other particular features discussed hereinafter permit continued functional interaction with the device 12 covered thereby.

With outer cover 10 removed, additional features of device 12 and inner cover 16 are better visualized. Specifically, cover 16 defines a variety of openings, with various uses, functions, and relationships with outer cover 10.

Inner cover 16 defines a primary opening generally 30 directed towards the front of the cover, primarily for visualizing a register output generally 32 through such opening 30. As represented in FIG. 1, because of such opening 30, the register output generally 32 may be observed through transparent outer cover 10.

In accordance with additional aspects of the subject invention, such opening 30 may be preferably defined generally by a semi-circle. Such arrangement accommodates not only the represented exemplary electronic register output generally 32, but other forms of mechanical register devices, as discussed in greater detail below.

Two openings generally 34 and 36 on the upper side of inner cover 16 accommodate additional functions.

Opening 34 (with outer cover 10 removed) permits insertion by a field operator of a so-called "reset to zero" probe device. As known to those of ordinary skill in the art, such a device resets the entire meter to zero, and is intentionally actuated by field personnel only whenever the entire meter is to be reset to its initial condition, "absolute zero". Additional details about such devices and their functions are well known to those of ordinary skill in the art without requiring additional discussion, and form no particular aspect of the subject invention.

Opening 36 defined in accordance with the subject invention through cover 16 permits the output of a light pipe, as discussed in greater detail below. For example, such light pipe output may involve an infrared output normally generated all the time, in order to show a customer (i.e., the utility company personnel) that the meter is operating correctly. It also permits an output by which such customer may verify calibration of the meter, discussed in greater detail below.

Cover 16 may optionally define several additional openings on the front portion thereof. Specifically, an opening generally 38 may be provided for a pair of optical communication ports 40 and 42. As well known to those of ordinary skill in the art, without requiring additional discussion, such optical ports permit specific devices to be used for communicating with electronic circuitry included within inner case 16. An enlarged protrusion generally 44 may be formed in transparent outer cover 10, to permit such optical communications ports to fully operate and function even while configured in the use environment thereof as represented by present FIG. 1. By having a pair of ports 40 and 42, simultaneous input and output functions may be conducted.

Such functions may include the output of various forms of data detected by meter device 12, as well as control inputs into electronic circuitry thereof.

A further opening generally 46 may be provided in the front face of inner cover 16 for receipt of an actuating element or switch 48. Such actuator 48 may combine with internal circuit board functions for constituting what is referred to in the industry as a "demand reset". Such optional function may also be thought of as a "monthly reset", by which a field technician may reset a particular measurement feature, such as might be associated with certain higher level functions on an optional circuit board. For example, a peak usage reading (based on rate of usage rather than cumulative usage) may be presented in a data register, and then cleared or "reset" to begin a subsequent measuring time period. FIG. 1 represents a pivoting actuation element generally 50, to which controlled access may be provided, and which may operate through outer cover 10 for actuation of switch 48, as well known to those of ordinary skill in the art without additional discussion.

Lastly illustrated, a further optional switch or actuator generally 52 may be provided through larger opening 30, such as for initiating a test sequence conducted in conjunction with operation of a higher level function board included within an exemplary device 12. As represented collectively by FIGS. 1 and 2, such "test" button 52 is only accessible to field personnel, while outer cover 10 is removed.

Considering the various above-referenced functions, it is an aspect of the subject invention that devices in accordance therewith may generally be field tested (to varying degrees, depending on specific embodiments) though not necessarily field serviced. Such a configuration permits maximum field interpretation of operation and activity, while inherently protecting field personnel from potential dangers arising from exposure to strong currents and/or high voltages as could occur if device 12 were more disassembled while mounted on or associated with box 18 for receipt of power distribution therefrom.

Another aspect of the exemplary embodiment device 12 of present FIGS. 1, 2 and 3 is how far the front portion generally 53 of outer case 10 projects outwardly from baseplate generally 14. The result is a relatively enlarged area generally 56 constituting an underside portion of case 10. As referenced in present FIG. 1, a field technician may advantageously use the size of case 10 as mechanical leverage by pressing upwardly in the direction of arrow 58 for dislodging device 12 from the receptacles (not shown) situated in box 18. As understood by those of ordinary skill in the art, respective spades or plug-in elements 60, 62, 64, and 66 on the back side of baseplate 14 are received in corresponding receptacles in box 18. Such spades 60, 62, 64, and 66 provide both mechanical support of device 12 relative to box 18 and provide electrical connections for power flowing through (i.e., both in and out of) device 12.

Typically, a field technician may initially insert spades 60 and 62 into their corresponding receiver elements within box 18, at an angle, and thereafter pivot device 12 downwardly into a flat position relative box 18 so that spades 64 and 66 become seated in their corresponding openings. Pressure on area 56 by the technician in the direction of arrow 58 reverses such typical insertion technique, for removal of device 12. Any significantly smaller depth of case 10 relative to baseplate 14 would correspondingly reduce the mechanical leverage achieved by such pivoting action, and make removal of device 12 relatively difficult in view of the intended relatively tight fit of spades 60, 62, 64 and 66.

Inner cover 16 and baseplate 14 are preferably comprised of any of various non-conductive high impact plastic materials. Generally, baseplate 14 is of a heavier gauge than that of case 16, for added strength and stability of device 12.

As represented in present FIGS. 2 and 3, baseplate 14 may include various orientation notches or slots 68, 70, and 72 (element 72 not seen in FIG. 2) for desired alignment of device 12 relative to outer case 10. Baseplate 14 may also be provided with feet or projections 74, 76, 78, and 80, simply serving to rest device 12 on the bottom of its base without requiring contact with or mechanical support on spades 60, 62, 64 and 66.

Another feature of baseplate 14 which may be practiced involves a pivoting hanger member generally 82. Such pivoting element may be pivoted about a pivot axis generally 84 so that an opening generally 86 may be selectively extended beyond the edge of notch 68. In such fashion, a field technician may temporarily support baseplate 14 and any component secured thereto, for freedom of working with two hands. Likewise, such temporary hanging may be practiced at various points during manufacture or assembly of a particular embodiment of the subject invention.

As will be discussed in greater detail below, the upper side generally 88 of baseplate 14 may support various wiring features in accordance with the subject invention, for conducting electricity to and from spades 60, 62, 64 and 66 relative to the remainder of the electrical components of device 12. Additional illustrations of such specific features appear in further figures below (for example, see FIG. 5) and are described in their related discussion.

For present purposes, FIG. 3 illustrates an opening generally 90 which may be formed through the bottom 92 of baseplate 14 into the interior of device 12. During original manufacture and/or assembly of a given embodiment of the subject invention, opening 90 remains unblocked, so as to permit electrical interconnections to be achieved with components otherwise seated inside of a given device 12. Through such electrical connections, the metrology features of device 12 may be calibrated (i.e., initialized for proper accuracy during use in a given environment), the details of which form no particular aspect of the subject invention.

Once calibration is completed via access through opening 90, the opening is sealed by insertion of a plug intended as being non-removable. Specifically, either a plug 94 or of a form as plug 96 is alternatively inserted into opening 90. Both plugs 94 and 96 create a link through the otherwise open circuitry supported on the upper side 88 of baseplate 14. Therefore, use of either plug 94 or 96 enables use of device 12. Without insertion of one of such plugs, no power via spades 60, 62, 64 and 66 would be properly routed to the interior components of device 12.

Plugs 94 and 96 provide respectively different functions. While neither are intended as being readily removable, plug 94 provides an upper cover generally 98 which is completely insulated from the circuitry otherwise linked by conductive (and interconnected) tongs 100 and 102 of plug 94. Therefore, insertion of plug 94 creates a tamper evident arrangement. In other words, in order to gain access to the electrical components or functioning of device 12 via baseplate 14, it is necessary to remove plug 94. Evidence of such removal will be readily apparent, due to the nature of its fit, wherefore a tamper-evident linkage is established.

On the other hand, alternative plug 96 has a pair of lateral side edge insulated elements 104 and 106, which laterally surround conductive screw elements 108 and 110. Through insertion of plug 96 into opening 90, and function of the tongs 112 and 114 of plug 96, a customer (i.e., utility company) can be provided internal access just as if opening 90 were still open, even though while plug 96 links the internal power circuitry and wiring for operation.

With use of such an arrangement and the modular, alternative plugs, a manufacturer may achieve desired access for manufacturing and initial calibration, and thereafter provide either a tamper-evident embodiment or interior sensing accessible embodiment, as desired by a customer, but with minimal variation to a given design.

FIGS. 4 through 9, inclusive, show various additional details concerning interior components and others of exemplary devices 12 and others in accordance with the subject invention.

Figure 4:
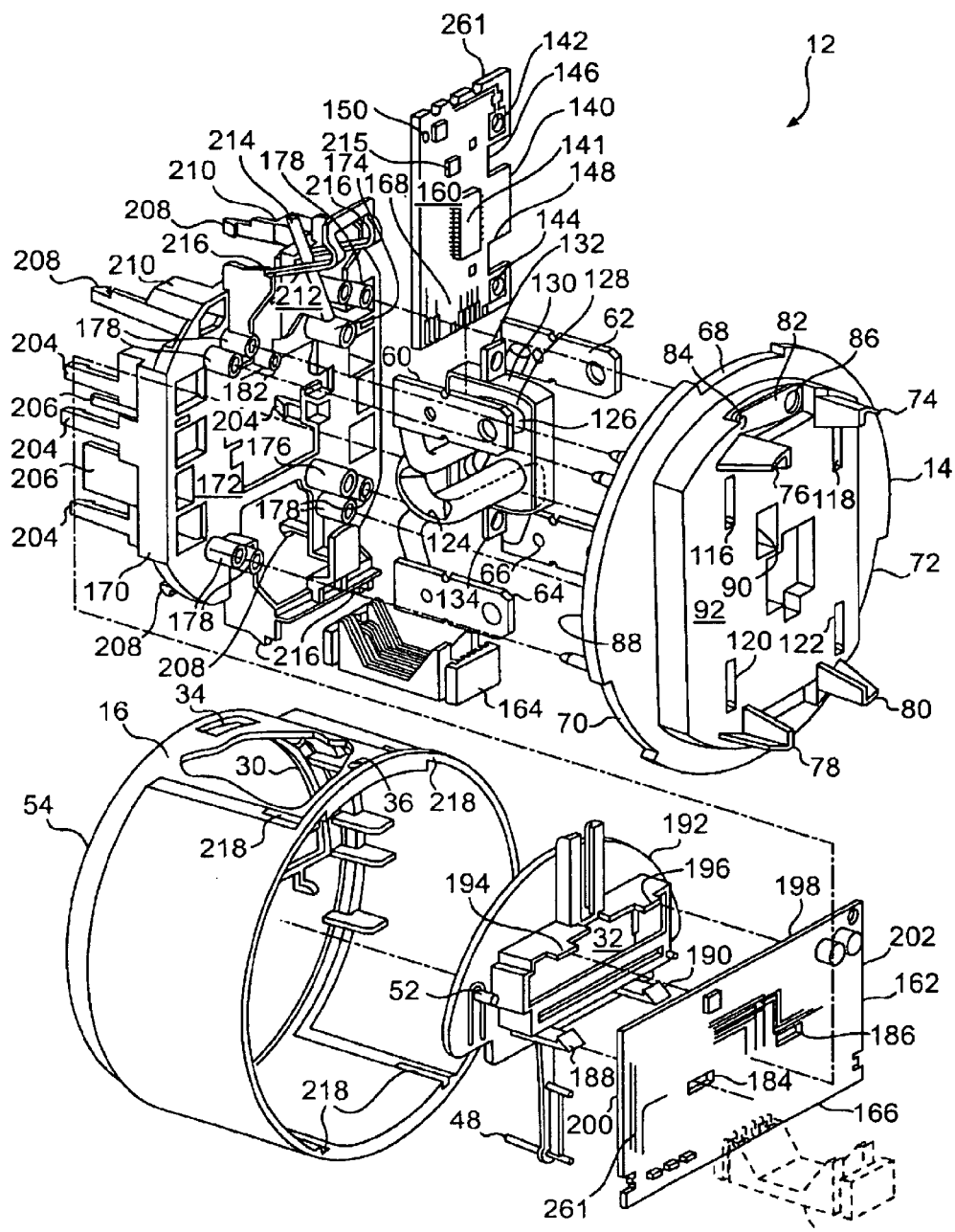
FIG. 4 is a fully exploded view of the exemplary embodiment as represented in present FIG. 3, with certain features shown in partial cutaway and in phantom lines for better illustrating the features thereof.
Figure 5:
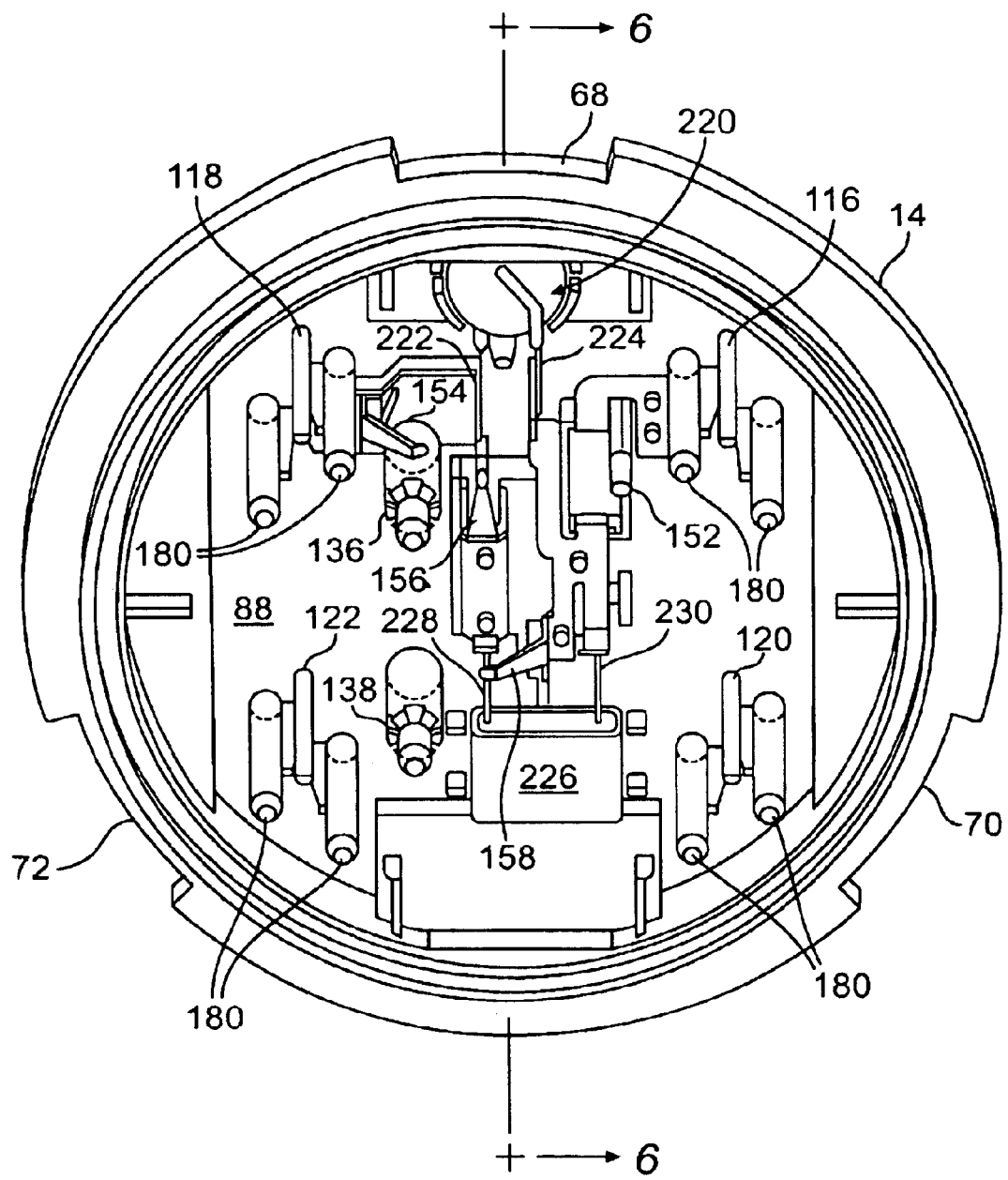
FIG. 5 is a generally front view, with slight top perspective, with a number of modular aspects of subject embodiments of the subject invention removed, for showing only a baseplate and certain circuitry and support features directly associated therewith.

Generally speaking, FIG. 4 shows an exploded view of the first exemplary embodiment of present FIG. 3, with partial cutaway of certain features in conjunction with inner case 16, for greater clarity in such illustration. FIG. 5 represents a generally front and slightly top perspective view of essentially baseplate 14 in accordance with the subject invention and various power wiring features associated therewith, as well as various support structure elements defined by such baseplate.

FIGS. 6 through 9, inclusive, are various sectional views.

Figure 6:
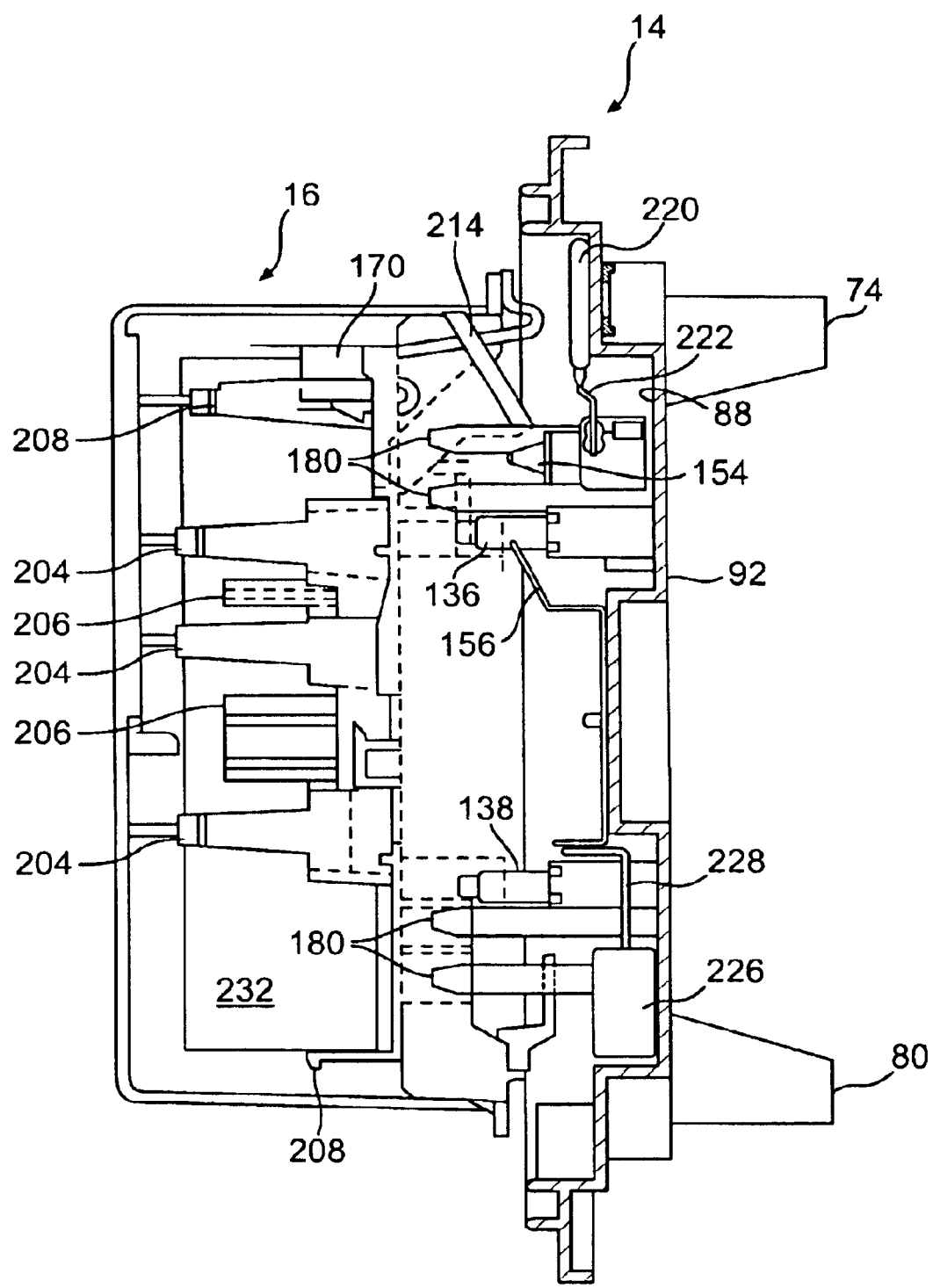
FIG. 6 is a generally side cross sectional view of the embodiment of present FIG. 5, taken along the section line 6—6 as illustrated in such FIG. 5, and showing in dotted line the relative position of additional features, including an inner assembly chassis and an inner cover.

FIG. 6 illustrates a generally cross sectional view, taken along section line 6—6 in present FIG. 5. FIG. 6 illustrates in solid lines the elements of present FIG. 5, and illustrates in dotted lines the position of the inner cover 16 and an inner assembly chassis as it would be situated during use.

Figure 7:
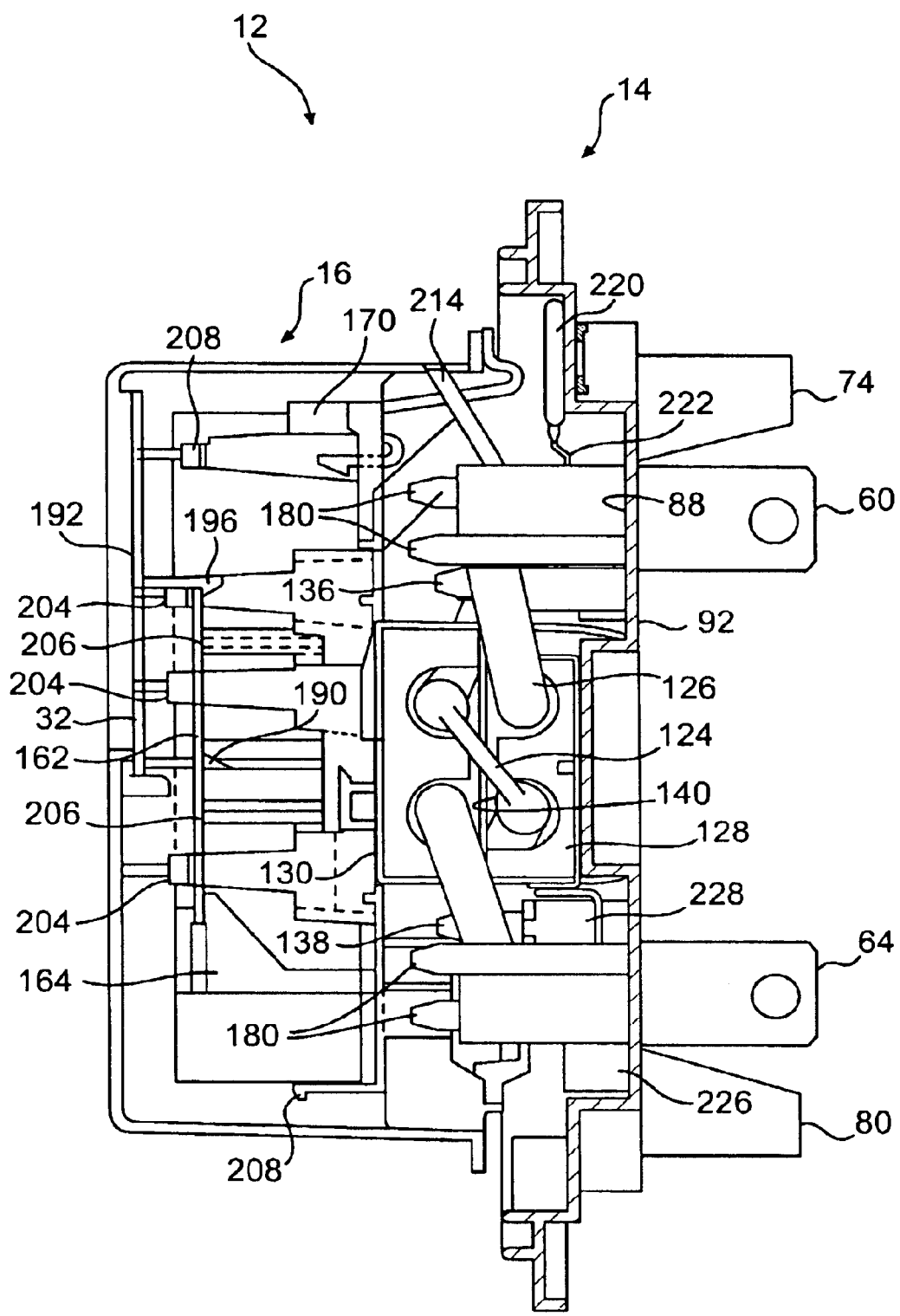
FIG. 7 is a side cross sectional view of the subject matter as in FIG. 6, with certain additional elements illustrated for forming a first exemplary embodiment in accordance with the subject invention, having relatively lower and upper circuit boards and an electronic display, and with certain metering coil assembly features shown in full for greater detail thereof.
Figure 8:
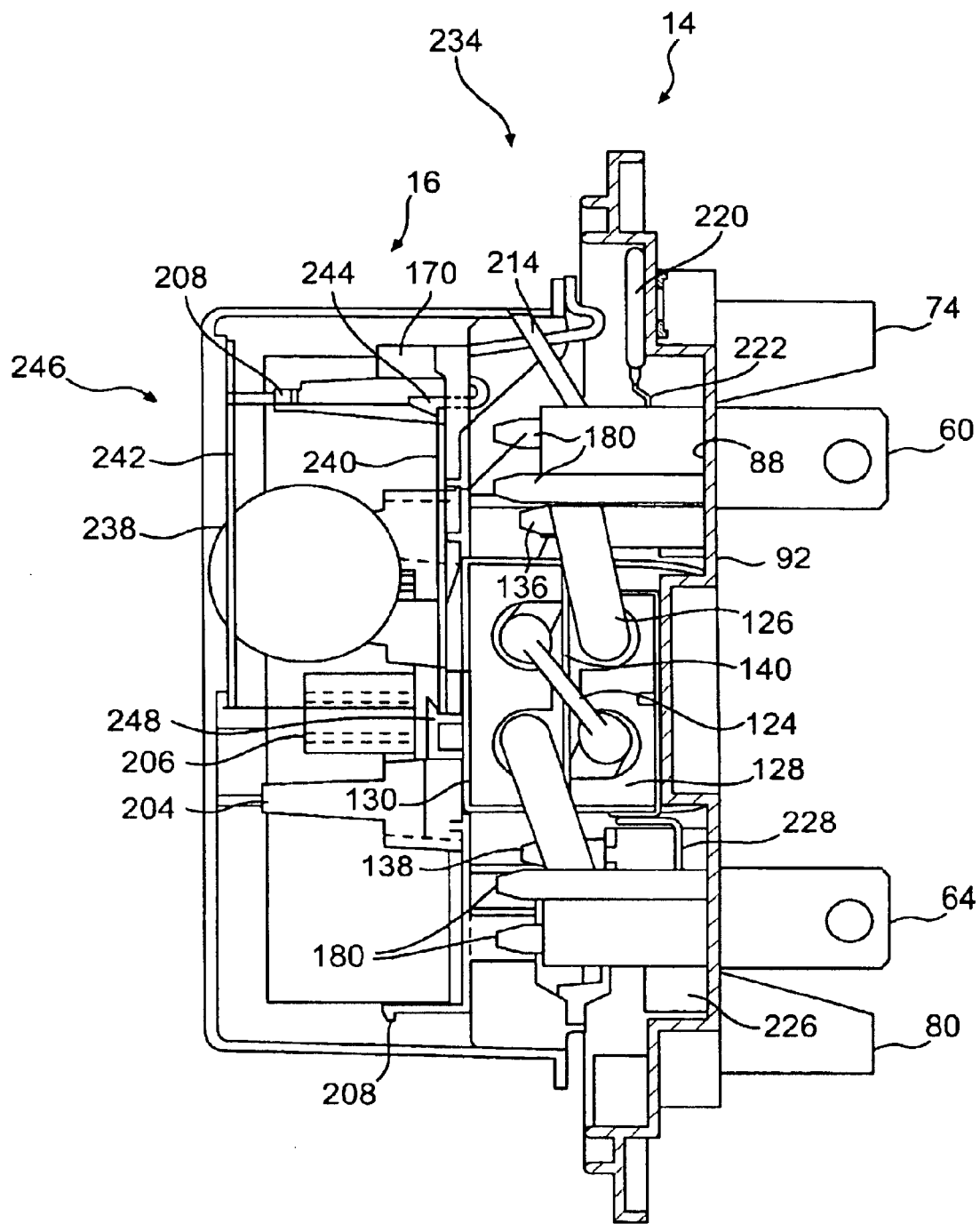
FIG. 8 is a side cross sectional view as in FIG. 7, and showing features in common with such FIG. 7 and with certain additional features of FIG. 7 removed in favor of a second exemplary embodiment of the subject invention making use of a particular form of mechanical register device involving a cyclometer mechanism.
Figure 9:
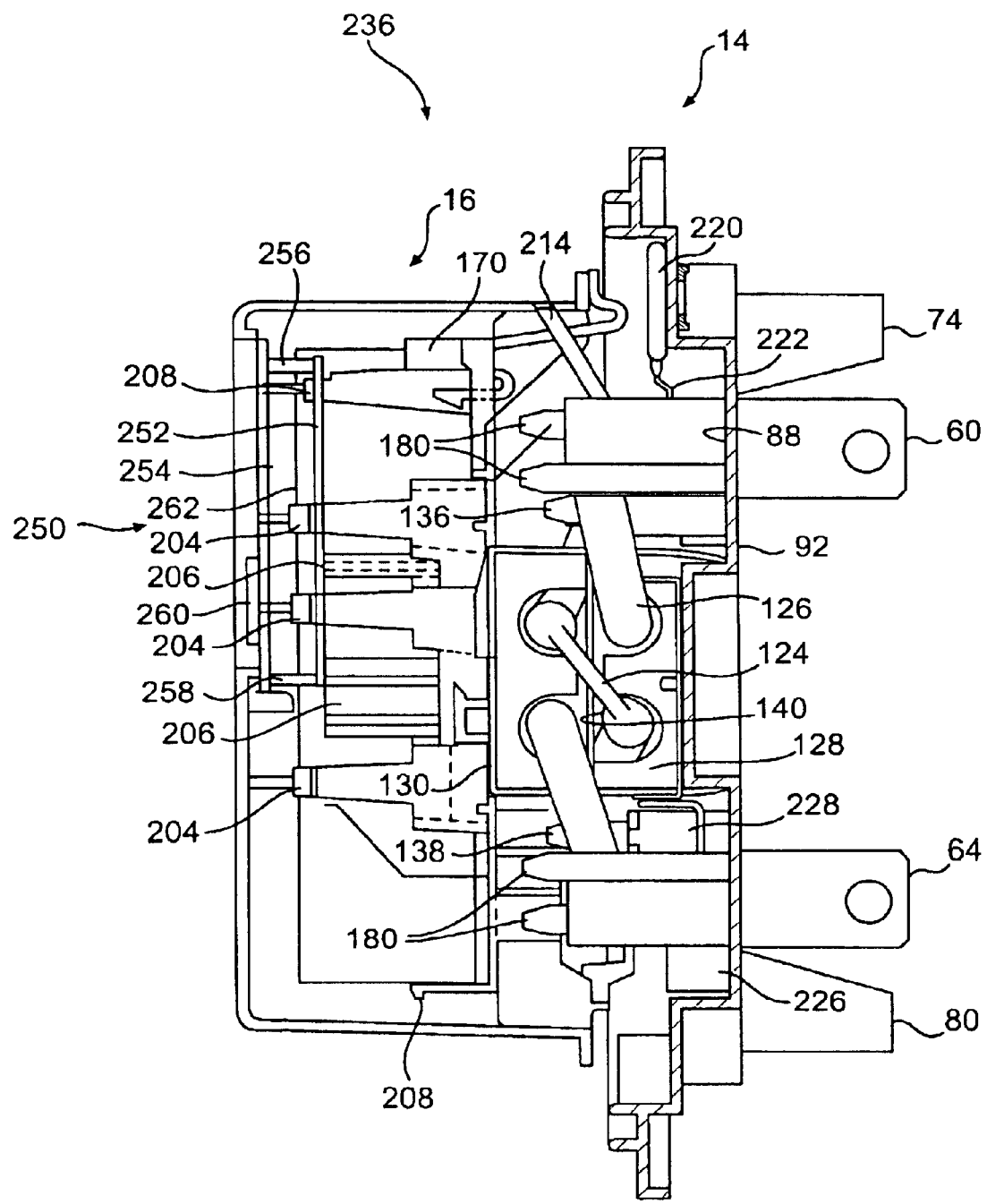
FIG. 9 is a side cross sectional view as in FIGS. 7 and 8, and showing a third embodiment of the subject invention making use of an alternative form of mechanical register, involving mechanized gears and dials for a clock-type mechanism.

FIGS. 7, 8, and 9 respectively show a first embodiment involving an electronic register assembly, a second embodiment involving a cyclometer register mechanical assembly, and a third embodiment having a clock register mechanical assembly. The illustrations of present FIGS. 7 through 9 show a cross section similar to that as in FIG. 6. Coil assembly features are shown in full in FIGS. 7 through 9, rather than in cross section, for additional detail thereof. While the features shown in phantom line in FIG. 6 continue to be shown in phantom line in FIGS. 7 through 9, the additional solid line illustrations in FIGS. 7 through 9 represent the alternative register assemblies as may be practiced in such exemplary embodiments in accordance with the subject invention.

For simplicity and clarity, repeat use of reference characters throughout such figures is intended to represent same or analogous features, elements, or steps of like numbered previously discussed reference characters, to eliminate redundancy of such description. Therefore, description of a reference character appearing elsewhere is applicable to the indicated figure, even if not expressly discussed in the context of such figure.

The exploded view of FIG. 4 is largely self-explanatory to one of ordinary skill in the art, in that respective alignments of the various components for forming a modular meter configuration and corresponding methodology in accordance with the subject invention are fully illustrated.

Referring particularly to present FIGS. 4 and 5, respective openings 116, 118, 120, and 122 are provided for respective spades 60, 62, 64 and 66. Such spades are attached to respective ends of electricity meter coil elements generally 124 and 126, so as to form a coil assembly. Interposed with such coil assembly is a laminated three legged or "figure 8" core generally 128 and its associated cover generally 130. Details of such construction and its operation are set forth in various patent subject matter incorporated by reference in the subject application (see above references). See, for example, U.S. Pat. Nos. 5,694,103 and 4,742,296. It is also to be understood those of ordinary skill in the art from a review of such incorporated patents and from the matter disclosed herein (e.g., see FIG. 4 and its related discussion) that the outer periphery of laminated core 128 and the interior opening of core cover or support 130 may not be identical. Thus, a slight gap may exist between the two features 128 and 130, which is not visible from the simplified illustrations of present FIGS. 7, 8, and 9.

As further shown, core cover (or support) 130 includes flanges with openings 132 and 134, which openings align and are fitted to upright posts generally 136 and 138 (see FIG. 5) for proper receipt and positioning of such elements. By virtue of the predetermined location of openings 116, 118, 120 and 122, and with the fixed position of the ends of coil elements 124 and 126 relative to contact spades 60, 62, 64 and 66, the positioning of cover 130 with posts 136 and 138 ensures proper alignment of the core 128 and the coils 124 and 126 for electricity meter operations, as understood by those of ordinary skill in the art.

Such posts preferably amount to splined tapered mating or mounting posts, which are preferably ultrasonically welded to the components which they support, for keeping all elements stable relative to one another. Other forms of securement may be practiced, such as gluing or other non-detrimental forms of welding and/or attachment.

Another of the components of device 12 properly aligned with such technique in accordance with the subject invention is a first or basic integrated circuit board generally 140. As referenced above, preferably all components are on one side of such circuit board 140, and comprise the basic kilowatt hour metrology function, as well understood by those of ordinary skill in the art. See also various of the above-referenced U.S. patents for additional was background information.

In accordance with the subject invention, first or basic metrology circuit board 140 is provided with a pair of openings generally 142 and 144 for correspondence and receipt in stacked fashion on posts 136 and 138. Such arrangement creates proper alignment of the gap within the center leg of core 128 relative to an appropriate electrical device supported on printed circuit board 140. As illustrated, notches generally 146 and 148 may be provided to fit around lateral legs of core 128, once the device 12 is assembled. Specifically in accordance with the subject invention, it should be understood that board 140 may carry electrical devices such as a Hall cell sensor 141 which, due to predetermined positioning per the subject invention, becomes properly located relative to the flux path associated with core 128, for desired sensing purposes.

Circuit board generally 140 may include a further opening 150 defined therein for receipt of a further support post generally 152 (see FIG. 5). Such three hole arrangement for board 140 (holes 142, 144, and 150) provides a highly stable three-point support reference for such standard or basic metrology circuit board.

As further shown in present FIG. 5, resilient connectors are placed on top side surface 88 of baseplate 14. Specifically, three cantilevered spring connector elements 154, 156 and 158 are provided for operative interaction with select points on underside generally 160 of circuit board 140, when properly positioned (after assembly) for making electrical connections with such board 140. In such fashion, and per the wiring generally represented in present FIG. 5, connections are made from spades 60, 62, 64 and 66 with circuit board 140 via resilient connectors 154, 156 and 158.

Additional description of such connections appears below with reference to FIGS. 10 and 11.

FIG. 4 further represents use of a second or optional higher level function circuit board 162. As referenced above, a variety of alternative functions may be included within such a board (generally well known to those of ordinary skill in the art) for providing "personality" or customization of the entire device 12 to meet the needs of a particular customer. In certain embodiments, all required power and signal transmissions needed for second or higher level function circuit board 162 may be provided via use of a fixed connector generally 164. Such a fixed connector interconnects the boards edge to edge. In doing so, additional support is provided on one side generally 166 of second board 162.

FIG. 4 illustrates fixed connector 164 in solid lines in a normally exploded view position thereof for receipt of an area generally 168 of first circuit board 140. FIG. 4 also shows a dotted line position generally 164' of such fixed connector illustrating its relationship and support of edge 166 of second board 162.

As represented in area 168 of first circuit board 140, fixed connector 164 communicates a variety of channels of power and information up to a second circuit board generally 162 (with all channels adequately shielded relative to one another). In a presently preferred exemplary embodiment, seven channels are provided, as discussed in greater detail below with reference to present-FIG. 11.

A further element which may be thought of as an inner assembly chassis 170 is provided in accordance with the subject invention. Basically, such chassis 170 and all other non-conductive elements (except circuit boards or other electrical components) within device 12 may be formulated from various plastic materials, in accordance with the gauge and durability desired for particular embodiments.

Chassis 170 includes a number of female receptacles defined on an underside generally 172 thereof for corresponding receipt of aligned support posts from the upper side 88 of baseplate 14. As shown particularly in present FIGS. 4 and 5, relatively larger female receptacles 174 and 176 are provided for mating receipt of relatively larger support posts 136 and 138, respectively. A plurality of generally smaller, paired female receptacles 178 are provided for corresponding interface with corresponding plurality of support posts generally 180, again on the upper side 88 of baseplate 14. Another relatively smaller post generally 182 is aligned for receipt of upright post 152 (discussed in greater detail above in conjunction with first circuit board 140).

As represented, an assembled configuration of chassis 170 "caps" the various support posts of baseplate 14, whether otherwise used or not. Therefore, a tight, secure, and stable arrangement is provided, without the use of any screws or other individual fastening elements.

As additionally represented in present FIGS. 4 and 5, a number of "snap fit" technology features are integrated into various embodiments of modular meter configurations in accordance with the subject invention. For example, circuit board 162 may be provided with additional openings 184 and 186 (see FIG. 4), which correspondingly receive projecting fingers 188 and 190 of a display holding element generally 192. Additional fingers 194 and 196 of such display holder 192 interact with a generally upper edge 198 of board 162. With such arrangement of four fingers 188, 190, 194 and 196, display holder 192 is secured to second circuit board 162 in the overall arrangement without requiring any respective individual attachment elements or fasteners.

Lateral edges generally 200 and 202 of board 162 may be held by respective fingers 204 and stop elements 206 of chassis 170. It should be understood by those of ordinary skill in the art that such corresponding fingers 204 and stop elements 206 of chassis 170 as to lateral edge 202 of board 162 are generally not visible in the FIG. 4 illustration. Therefore, the position of board 162 is secured with a "snap fit" arrangement while the electrical connections thereof are secured at least partly through fixed connector 164 (discussed in greater detail below with reference to present FIG. 11).

It is to be understood that additional fingers, stops, and other elements (such as fingers 208 and stops 210 of chassis 170 may be involved with securement of alternative registers or devices in place of second board 162 and/or display holder 192. In fact, it is to be understood that virtually every opening and surface of chassis 170 contributes to its support and/or guide function in one or more alternative configurations of the subject invention.

Yet another support feature of chassis 170 is extension 212, which functions to properly position an optical light pipe generally 214, extending between a corresponding light emitting device 215 on first circuit board 140 and inner case opening generally 36 (see FIGS. 1, 2, and 4). Examples of the specific functions of such light pipe will be discussed in greater detail below.

Still additional fingers or projections 216 are provided on four relatively outer corners of chassis 170 for securing inner case 16 thereto through interaction with corresponding openings 218 of such case 16. As understood by those of ordinary skill in the art, ultrasonic welding of female receptacles 174, 176, 178 and 182 of chassis 170 with corresponding upright mating/mounting posts 136, 138, 152 and 180 of baseplate 14, results in complete securement of all internal features of device 12 once inner cover 16 is secured.

FIG. 5 additionally shows certain aspects of power supply features in accordance with the subject invention, as supported relative to baseplate 14. Specifically, a varistor generally 220 may be received on upper side 88 of baseplate 14 and connected via respective leads 222 and 224 and other power supply network circuitry, as discussed in greater detail below with reference to present FIGS. 10 and 11.

Also, a capacitor 226 may be received on upper side 88 of baseplate 14 and connected by respective leads 228 and 230 to remaining power supply circuitry, again as discussed in greater detail with reference to present FIGS. 10 and 11.

As generally shown in present FIG. 5, the upper side 88 of baseplate 14 may be provided with various projections (no reference characters indicated) for securing the position of such elements, varistor 220 and capacitor 226.

FIGS. 6 through 9, inclusive, show various cross sectional illustrations, primarily referencing previously discussed subject matter while illustrating variations involved among different embodiments of the subject invention. Accordingly, it is to be understood that repeat use of reference characters is intended to encompass the prior discussion of such features, as applicable to such corresponding features.

More specifically, FIG. 6 illustrates in solid line a side cross sectional view of the features illustrated in present FIG. 5, taken along section line 6—6 shown therein. Additional features represented in dotted line or phantom primarily relate to various aspects of inner cover 16 and inner assembly chassis 170. One aspect of present FIG. 6 is that it illustrates the availability of additional space, such as in general area 232 thereof, within which additional optional-features may be received, such as a modem (not shown) for transmission of data via telephone lines.

FIG. 7 provides an identical illustration to FIG. 6, with the addition of various coil assembly features and features specifically for the above-referenced first embodiment of the subject invention, involving two integrated circuit boards and corresponding solid state circuitry and an electronic register for data output.

More particularly, inclusion of full view illustrations in FIGS. 7 through 9 (rather than cross sections) of core elements 124 and 126, laminated core 128 and core cover (or support) 130 results in blocked viewing of cantilevered connectors 154 and 156.

The additional elements illustrated in present FIG. 7 relative to FIG. 6 so as to illustrate a more complete first embodiment of device 12 in accordance with the subject invention generally include the following. First, the basic function or first circuit board 140 is shown, as used in combination with the customized feature or second circuit board generally 162.

As shown in FIG. 7, circuit board 162 is held by various fingers 204 of chassis 170 cooperating with stop elements generally 206 thereof. A display holder 192 is secured to such second circuit board 162 by respective projections or fingers 190 and 196. Register output 32 is held by display holder 192. Lastly, such first embodiment includes a representation of fixed connector 164, conveying power and data from first circuit board 140 to second circuit board 162, as generally discussed above.

FIG. 7 also includes illustrations of spades 60 and 64, which are the spades in the forefront, when viewing device 12 from the right side, in keeping with the more full illustration of such features and the core and the coil assembly features, rather than a cross sectional view thereof.

FIGS. 8 and 9 are respective mechanical register assemblies. Specifically, FIG. 8 represents a second embodiment of the subject invention generally device 234 while FIG. 9 illustrates generally a third embodiment of the subject invention device generally 236. Such second and third devices may comprise cyclometer register mechanical assembly and clock register mechanical assembly devices, respectively. Details of various such assemblies are noted in pertinent ones of the above-referenced patents, incorporated herein by reference, and form no particular details of the subject invention beyond the context of the disclosures herewith.

With more specific reference to the representative alternative embodiments of present FIGS. 8 and 9, again, both such embodiments include full illustrations of spades 60 and 64, coil elements 124 and 126, laminated core 128 and core cover 130, such that cantilevered connectors 154 and 156 are no longer visible. Since both exemplary embodiments 234 and 236 of FIGS. 8 and 9 respectively involve various mechanical assemblies, there are no illustrations (as in FIG. 7) for second board 162, display holder 192 or its associated fingers 190 and 196, electronic register output 32, or fixed connector 164.

More particularly, the second embodiment device 234 of FIG. 8 may include a mechanical wheel assembly, with numbers mounted on a wheel mounting to fingers or extensions of the support chassis 170. More specifically, exemplary wheel generally 238 represents a plurality of such wheels laterally disposed adjacent one another for providing mechanical register output.

As well understood by those of ordinary skill in the art without additional details, such plurality of wheels 238 may be supported within an integral structure, such as having a rear wall generally 240 and front wall 242 thereof. A pair of upper curved fingers generally 244 (only one shown due to the cross sectional nature of FIG. 8) capture an upper edge of rear or back wall generally 240 of the integral cyclometer mechanical register assembly generally 246. Such curved fingers 244 are preferably integrally formed with chassis 170, which also provides a pair of lower capture elements generally 248 (only one shown due to the cross sectional nature of FIG. 8) for capturing a lower edge of back or rear wall 240 of mechanical register assembly 246.

As shown, the cantilevered curved nature of upper fingers 244 permit a field technician or manufacturing personnel to flex the curved fingers 244 for introducing or alternately removing mechanical assembly register 246. Once such mechanical register assembly 246 is secured to chassis 170, the inner cover 16 may be applied, as otherwise understood from the remainder of the specification.

The mechanical register assembly device embodiment 236 of present FIG. 9 is similar to that of present FIG. 8, but has its own form of mechanical register assembly generally 250. Such mechanical register 250 may comprise a clock register type of assembly, well known to those of ordinary skill in the art. Such assembly 250 may preferably comprise an integral arrangement having rear and front walls 252 and 254, respectively. As illustrated, the rear wall may be captured or secured by chassis 170, including an upper pair of elements 208 thereof, and intermediate pairs of fingers 204 thereof, cooperating with both pairs of stop elements 206. Exemplary support elements 256 and 258 represent mechanical support between rear wall 252 and front wall 254 of mechanical register assembly 250.

As understood by those of ordinary skill in the art, a plurality of relatively smaller dial elements generally 260 are driven clock-style in respective scaled relationships via a series of gears, represented by dotted line generally 262, and mounted generally in parallel with the respective rear and front walls 252 and 254 of integral mechanical assembly 250. In some instances of plural dials, alternate dials are rotated either clockwise or counterclockwise.

As will be understood by those of ordinary skill in the art, such gears generally 262 are motor driven, as are the respective plurality of wheels 238 of cyclometer register mechanical assembly generally 246. In general, a basic wire connection between the motor drive of respective mechanical assemblies 250 and 246 may be interconnected with the main or basic metrology circuit board 140, for driving same. One convenient alternative interconnection for such power (or drive control) may be obtained by the securement of a connector generally to the area 168 of circuit board 140 (not seen in FIGS. 8 and 9). Those of ordinary skill in the art are familiar with such motor drive requirements without additional discussion, details of which form no particular aspects of the subject invention.

Figure 10:
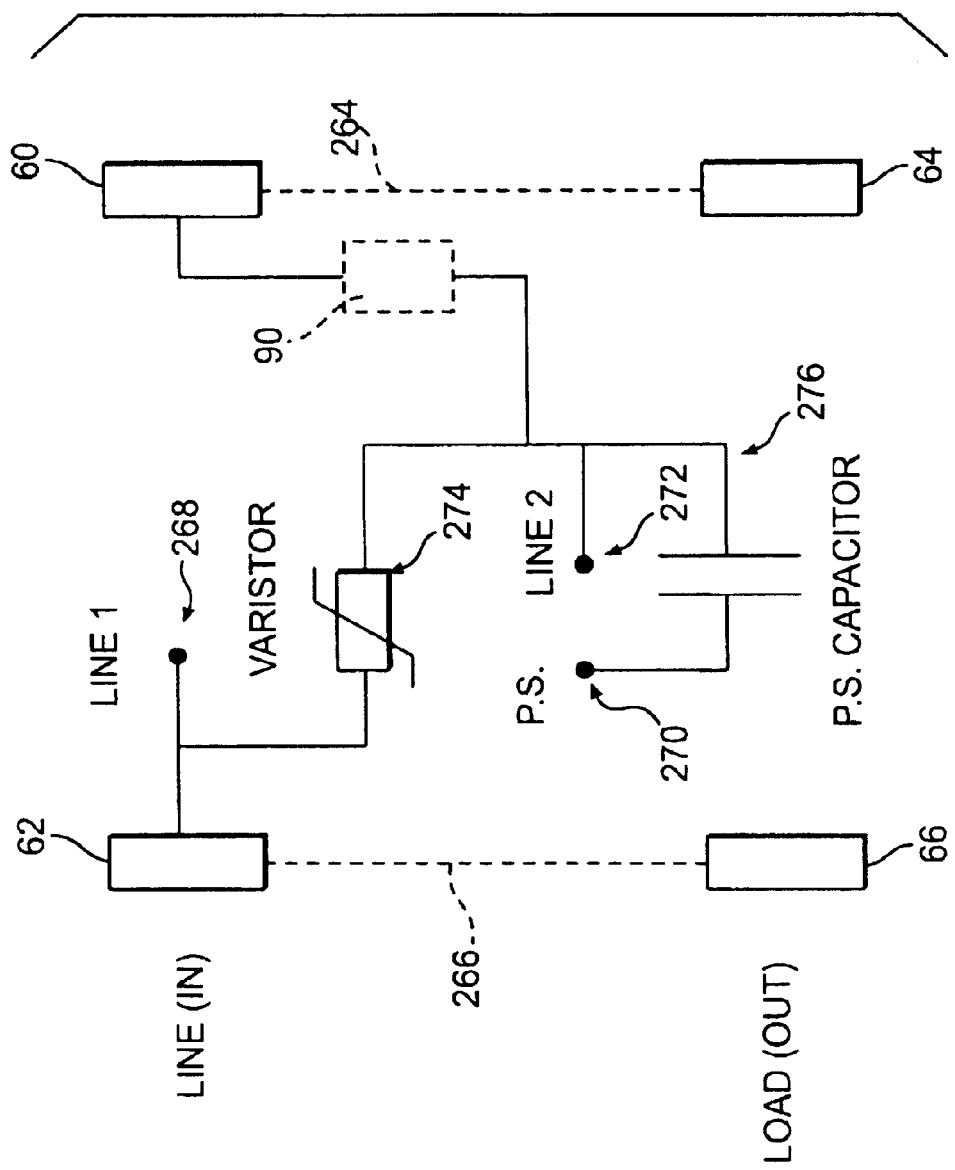
FIG. 10 is a diagrammatical schematic view of certain baseplate features and corresponding simplified wiring features in accordance with the present invention, including labeling for various of certain diagrammatical representations.

FIG. 10 represents a simplified wiring diagram involving power supply aspects and others of the subject invention. Very briefly, the four spades or plug-ins 60, 62, 64 and 66 are representative of the paired line inputs and paired load outputs, as illustrated by the schematic diagram. For greater clarity, representations of the full coil assembly including coil members 124 and 126, and laminated core 128 and core cover 130, are omitted. However, respective coil elements interconnect input spade 60 with output spade 64 and interconnect input spade 62 with output spade 66, as generally represented by schematic dotted line elements 264 and 266, respectively.

The FIG. 10 schematic diagram represents three respective terminal points 268, 270 and 272. Such terminal points respectively correspond, for example, with the three respective cantilevered contacts 154, 156 and 158 (see FIG. 5) for creating contacts with the first circuit board (or basic metrology board) generally 140. See also the schematic representations of FIG. 11, discussed in greater detail below.

In other words, terminal contacts 268, 270 and 272 comprise inputs to the metrology board 140, such that both Line 1 and Line 2 inputs (taken directly from spades 62 and 60, respectively) are provided to circuit board 140, as well as a denominated power supply ("P.S.") input.

In the exemplary embodiment of present FIG. 10, varistor generally 274 functions as well known to those of ordinary skill in the art for shunting any line disturbances and for generally protecting the overall wiring circuitry. Typically, for a conventional household power distribution input in the United States, the nominal voltage across Lines 1 and 2 (across spades 62 and 60 and across contacts 268 and 272, respectively) is 240 volts AC (VAC). As well known to those of ordinary skill in the art, a varistor provides a variable resistance, dependent on an applied voltage level, and therefore provides the above-referenced shunting and protective functions.

A reduced "power supply" voltage of nominally 12 volts AC (VAC) is provided at P.S. terminal 270 through use of P.S. capacitor generally 276, as represented by the circuitry arrangement of the schematic representations of present FIG. 10. Using for example, a capacitor value of 0.33 microfarads, the nominal 240 volts AC is dropped to 12 volts AC at contact point P.S. 270. As known to those of ordinary skill in the art, a capacitor acts as an open circuit to DC voltage and otherwise provides a responsive circuit element to AC voltages due to the alternate charging and discharging nature of a capacitor. It is to be understood that different values of components indicated herein or other arrangements for obtaining a power supply may be utilized in accordance with the broader aspects of the subject invention.

The schematic diagram of FIG. 10 further represents the opening 90 (see FIG. 4) associated with baseplate 14. As discussed above, once the physical arrangements of the current spades, coil assembly and sensing laminated core and core cover are fixed, an open circuit point is still provided by the opening 90 feature. Using various probe technologies (forming no particular aspect of the subject invention), those of ordinary skill in the art will understand that the metrology function may then be calibrated for the specific physical arrangement of components as implemented on a given device by a given arrangement of the subject invention. Calibration may include "programming" the device with a slight correction factor to account for such specific physical embodiment. After such operation, either one of alternative modular plugs 94 and 96 (see FIG. 3 and its related discussion) may be seated within opening 90, so that the otherwise open circuit is completed for normal field operation, with calibration complete.

Figure 11:
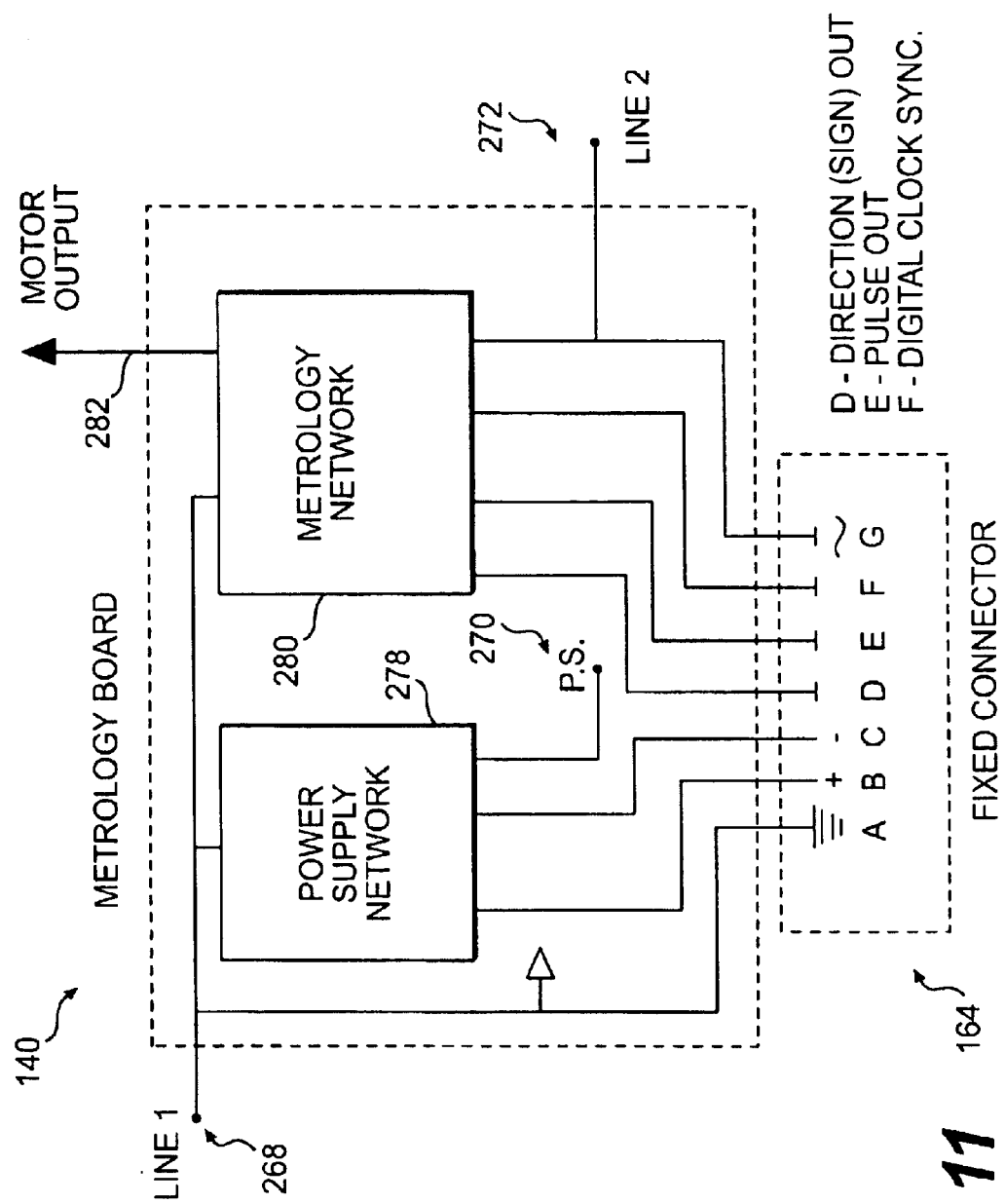
FIG. 11 is a functional schematic of various exemplary power supply features in accordance with the subject invention, and their relation to an exemplary fixed connector in accordance with the subject invention, including labeled diagrammatical representations.

FIG. 11 is a block diagram representation of additional power supply features and other features in accordance with the subject invention, including their relation to powering the metrology function and "communicating" among basic circuit board 140 and any other circuit boards associated therewith, such as via a fixed connector generally 164.

FIG. 11 represents the entire metrology board generally 140 in dotted line block diagram fashion, and likewise represents fixed connector generally 164. A portion of the features of each such component metrology board 140 and fixed connector 164 are further diagrammatically represented within their dotted line block diagram representations. Representing the relationship with the wiring diagram of FIG. 10, respective terminal contact points 268, 270, and 272 are illustrated in FIG. 11 as all contacting with metrology board 140. As referenced above, preferably such contacts include cantilevered extending connections (generally 154, 156 and 158, respectively) that are brought into contact with metrology board 140 whenever it is seated in its desired position relative the coil assembly and other features in accordance with the subject invention.

Included as part of metrology board generally 140 is a power supply network generally 278. As represented, such power supply network 278 receives at least two inputs, via Line 1 terminal contact 268 (nominally 240 VAC) and the power supply P.S. terminal contact 270 (nominally 12 VAC). Power supply networks which may be carried on circuit boards are well known to those of ordinary skill in the art, and particular details of power supply network 278 form no particular aspect of the subject invention. See also various patents incorporated herein by reference, as referenced above.

Generally in accordance with the subject invention, power supply network 278 operates on the inputs thereto for outputting plus or minus 2.5 volts DC (VDC). As represented in earlier figures, fixed connector 164 preferably engages an edge area generally 168 of metrology board 140, for achieving various connections therewith. As represented in present FIG. 11, respective terminal positions B and C of fixed connector generally 164 correspond respectively with the plus and minus 2.5 VDC outputs of power supply network 278. A Line 1 ground connection is also carried down to fixed connector 164 at terminal A thereof (see FIG. 11).

Metrology board 140 also carries circuit board components for performing the basic kilowatt hour data function of a device in accordance with the subject invention. Such actual function is represented by metrology network 280, examples of which are well known to those of ordinary skill in the art and details of which form no particular aspect of the subject invention. See also various patents incorporated herein by reference, as referenced above.

Referring more specifically to the diagrammatic representation of present FIG. 11, it may be observed that the respective Line 1 terminal contact 268 and Line 2 terminal contact 272 associated with metrology board 140 result in application of such respective line voltages to metrology network 280 and also to a terminal G of fixed connector 164. Metrology network 280 has at least four other outputs, three of which are associated with terminals of fixed connector 164 as illustrated, and a fourth via line 282 which directly outputs an available motor output signal, such as for driving any mechanical register assemblies (see FIGS. 8 and 9 and their related discussion).

Referring more particularly to the three outputs D, E, and F to fixed connector 164 from metrology network 280, the following is to be understood. The output signal coming from metrology network 280 to terminal D of fixed connector 164 constitutes a sign (+ or –) indicative of the direction of power flow (which is typically negative during a consumption mode and plus during any production mode, such as where power is being put back on to the grid by the ultimate customer).

The output of metrology network 280 resulting in terminal E of fixed connector 164 relates to a pulse output, reflecting data generation by the metrology network 280.

Such pulse output E may be utilized for various functions. For example, it may be utilized to modulate an infrared LED 215 associated with light pipe 214 (see discussion above) for providing a signal external to casings for a device in accordance with the subject invention. A customer (for example utility company field personnel) may check such pulse signal for proper operation of the meter without interruption thereof. Additionally, it is to be understood that fixed connector 164 is also interconnected with any other circuit boards being utilized, such as an exemplary second circuit board 162 (see FIG. 4 and its related discussion). Accordingly, such pulse output signal E is being passed to such higher level function circuit board for possible use there.

Likewise, metrology network 280 generates on terminal F of fixed connector 164 a digital clock synchronization pulse, such as a 60 Hertz square wave, which is passed via such connector 164 to any further circuit boards for use thereby.

As a net result of the schematic arrangements of present FIG. 11, line power (240 VAC), power supply voltage (plus or minus 2.5 VDC) and various data and clocking information is transmitted via fixed connector 164 to a further circuit board, such as high level function board 162. Such communication is one-way, meaning that the subsequent circuit board makes use as needed of such power and data, without necessarily reflecting any feedback along fixed connector 164 to metrology board 140. Those of ordinary skill in the art will understand that the diagrammatic representation of fixed connector 164 in FIG. 11 omits for clarity the further connections that would be made from such connector to additional circuit boards, as represented in other figures herewith and explained in their related discussion.

Numerous modifications and variations may be made for specific embodiments of the subject invention without departing from the broader spirit and scope thereof. For example, multiple additional circuit boards may be utilized with a basic metrology board 140, instead of a single additional such circuit board 162. In such instance, additional functions may be selectively provided for further customizing a meter product for a given customer, and wiring arrangements and connectors alike could be modified as needed in accordance with the subject invention for providing such a multiple board arrangements.

Another aspect of certain embodiments of the present invention is that all flexible leads have been eliminated throughout the devices. This means that a highly stable configuration is provided. For example, the coil elements (124 and 126 of FIG. 4 and diagrammatic representations 264 and 266 of FIG. 10) do not touch the core 128 (FIG. 4) or core cover 130 (FIG. 4). The respective holes and posts relative to the baseplate help align the core and coil. Introduction of a calibration factor (as discussed above) takes care of fine tuning or exact position inaccuracies. Otherwise, the subject exemplary arrangements help provide fixture to the basic flux path utilized for metrology operations.

Still further, it is preferred that ultrasonic welding be utilized to capture all of the basic components in place once fully assembled as desired. With opening 90 provided in baseplate 14 (prior to introduction of either of alternative plugs 94 and 96), the subject metering device can still be calibrated for precision. The multiple size steps and splined posts initially help align and fit the circuit board to the laminated core, and align other elements, so that all basic desired relationships are established, and then fine tuned by such calibration.

It is to be understood that additional variations may be practiced. For example, while any second (or additional) circuit board(s) may be provided with plus or minus 2.5 VDC via fixed connector 164, in some embodiments such additional boards may make use of their own power supply. All such modified embodiments, as may be desired for a user in a particular circumstance, are intended to come within the broader spirit and scope of the subject invention.

Similarly, internal structural changes may be practiced. For example, light pipe 214 (see FIG. 4 and others) is generally shown as a straight shaft. In the illustrated embodiments, it isolates the output of a particular infrared LED 215 for showing that the lower or basic metrology board 140 is properly working. However, in certain embodiments, the light pipe may be more S-shaped instead of just straight, to accommodate desirable modifications in the internal component arrangements of a given embodiment.

Other variations may relate to the forms of data outputs and/or reset actuators utilized. For example, many embodiments may not have multiple reset actuators with different functions, but only a most basic "reset to zero" function in a fairly basic or simple standard electricity meter embodiment. All such versions and embodiments are intended to come within the spirit and scope of this invention.

While various forms of mechanical registers and electronic registers have been specifically represented, other sizes and shapes of registers may be generally practiced, with the chassis 170 or other securing features modified accordingly, per the broader teachings of this invention.

Regarding outputs, various alternative arrangements may be practiced. For example, with no metal utilized in otherwise plastic faceplate or cover features, an antenna 261 may be provided directly onto a circuit board (such as additional or second circuit board 162) for radiating metering information directly from such circuit board without requiring a second antenna. Any such arrangement may involve greater frequency communications both in and out, meaning that some devices may permit the high level functions of an additional circuit board to be queried by a field technician or reader, for calling for various forms of output, or otherwise controlled or reprogrammed by communications in. In some instances, such higher level function boards may incorporate a non-volatile memory for maintaining determined data even during power outages.

Other forms of output which may be utilized are represented by the pulse output (terminal E of fixed connector 164—FIG. 11). Such output is two fold in that it permits and enables the light pipe form of output (as referenced above) and the communication of a basic metrology signal from lower or basic metrology board 140 to a higher order or higher level function circuit board generally 162.

Still further, as broadly referenced above, such higher level circuit board may be provided with connections for optical ports (see elements 40 and 42 of present FIGS. 1 and 2), by which communications may also be directed in and out of the electric meter. Also, telephone line connections may be provided by including a modem within a given device, both with wires or with wireless transmission, such as cellular telephone service.

Generally in accordance with this invention, it is to be understood that all of such modifications and variations may be practiced and obtained based on use of a basic combined arrangement in accordance with this invention, comprising, for example, the main baseplate 14, main or basic metrology circuit board 140, and chassis 170 (or variations thereof) for support of additional internal components, combined with the support posts and arrangements of baseplate 14. By decentralizing certain features (such as splitting up basic and higher level functions into separate circuit boards), the present invention achieves advantages with a modular approach not heretofore obtainable. Likewise, by the various clamping action support arrangements and snap fit technologies, an entire array of various modular meter configurations (and corresponding methodologies) may be provided without requiring any screws or similar individual connectors or fasteners. Therefore, all such modifications and variations within the broader scope of the subject invention as would be readily apparent to one of ordinary skill in the art are intended as part of the subject invention.

What is claimed is:

1. An electricity meter, including:
   an encloseable casing comprising a cover and a baseplate;
   electrical connection spades extending though said baseplate and outwardly therefrom for mechanical seating thereof in a mating receptacle; and
   a metrology board and resilient connectors housed within said casing, said metrology board electrically connecting to said spades through said resilient connectors so that said metrology board is connected for producing a signal indicating electricity consumption.

2. An electricity meter as in claim 1, further including mating posts and holes associated with said baseplate and said metrology board for mutual physical connection thereof.

3. An electricity meter as in claim 2, wherein said baseplate has tapered posts and said metrology board defines holes therein to mate with said tapered posts such that said board is supported on said baseplate in a predetermined position relative thereto.

4. An electricity meter as in claim 3, further including weldments such that said baseplate and said metrology board are welded to each other in said predetermined relative position.

5. An electricity meter as in claim 3, further including a coil electrically associated with said spades and physically supported in predetermined relationship to said baseplate, and wherein said metrology board includes a Hall Effect sensor that is positioned relatively adjacent said coil in a preselected position predetermined by the predetermined positions respectively of said coil and said metrology board relative to said baseplate.

6. An electricity meter as in claim 2, further including:
   a chassis supported on said baseplate;
   a light source supported on said metrology board and indicative of a signal therefrom; and
   a light pipe supported on said chassis and positioned to carry light from said light source to outside said cover.

7. An electricity meter as in claim 2, further including an antenna supported on said metrology board and electrically associated therewith for transmitting through said cover a radio sigal.

8. An electricity meter as in claim 2, further including a chassis supported on said baseplate.

9. An electricity meter as in claim 8, further including;
   a circuit board at least partially supported on said chassis, providing additional functionality beyond the functionality provided by said metrology board; and
   a fixed connector interconnecting between said metrology board and said circuit board for electrical connections there between and for at least partial mechanical support of said circuit board.

10. An electricity meter as in claim 8, further including an electronic meter display supported on said chassis.

11. An electricity meter as in claim 8, further including a mechanical meter display supported on said chassis.

12. An electricity meter as in claim 1, wherein said resilient connectors comprise a plurality of cantilevered spring connector elements.

13. An electricity meter as in claim 1, further including a main circuit supported on said baseplate and defining an initial opening therefrom for calibration access to said metrology board during assembly of said electricity meter.

14. An electricity meter as in claim 13, further including a nonremovable bridge clip received in said main circuit initial opening for providing a tamper proof circuit bridge closure to said opening.

15. An electricity meter as in claim 14, wherein said bridge clip further includes exposed terminals to provide continued access to said main circuit for field testing of said electricity meter after assembly thereof.

16. An electricity meter, having:
   an enclosure comprising a cover and a baseplate having tapered mounting posts;
   spades extending out from said baseplate for insertion into a meter receiving receptacle;
   a metrology board having holes mating with said tapered posts for mounting said metrology board on said baseplate, and resilient connectors electrically connecting said metrology board to said spades such that said metrology board is capable of producing a signal indicating electricity consumption;
   a circuit board mounted within said enclosure; and
   a fixed connector electrically connecting said metrology board to said circuit board.

17. A meter as in claim 16, further including an antenna within said enclosure supported for transmitting through said cover a radio signal corresponding to electricity consumption as determined by said metrology board.

18. A meter as in claim 16, wherein said fixed connector includes multiple conductors for carrying data and power sisals between said metrology board and said circuit board.

19. A meter as in claim 16, further including:
   a chassis supported on said baseplate;
   a light source supported on said metrology board; and
   a light pipe supported on said chassis and positioned to carry light from said light source to outside of said cover.

20. A meter as in claim 19, wherein:
   said chassis further defines mating connector holes matching with said baseplate tapered posts; and said meter further includes
   a coil electrically associated with said spades; and
   a Hall Effect sensor electrically associated with said metrology board and operatively interactive with said coil for sensing electricity consumption, with said coil and said sensor aligned in predetermined positions as determined by said baseplate tapered mounting posts and said metrology board mating holes.

21. A meter as in claim 16, wherein said circuit board provides additional functionality beyond the functionality provided by said metrology board.

22. A meter as in claim 16, further including:
   a chassis defining mating connector holes and mounted therewith on said baseplate tapered mounting posts; and
   a meter display mounted on said chassis; wherein
   said metrology board, said circuit board, said fixed connector, said chassis and said meter display are all secured in snap-fit arrangements.

23. A meter as in claim 22, wherein said cover is an at least partially opaque inner cover connectable with said baseplate, and wherein said meter further includes an at least partially transparent outer cover received about said inner cover and connectable with said baseplate such that said meter display is visible through said outer cover.

24. A meter as in claim 16, further including:
a main circuit supported on said baseplate and defining an opening therein for calibration access to said metrology board and said customized features circuit board during assembly of said electricity meter; and
a non-removable bridge clip received in said main circuit opening for providing a tamper proof circuit bridge thereto.

25. A modular electricity meter with multiple components selected from alternatives and assembled with snap it and interlocking arrangements, comprising:
an encloseable casing having a common baseplate with plural mounting posts and an inner cover removably interconnected thereto;
a plurality of electrical connection mounting spades extending from said casing through said baseplate and outwardly therefrom, for mechanical seating thereof in an electricity meter junction box receptacle;
a basic metrology board, defining mounting holes therein for mating with said baseplate mounting posts for support of said basic metrology board within said casing in a predetermined relationship with said baseplate;
a plurality of resilient connectors received within said casing and electrically connecting between said basic metrology board and said spades so that said basic metrology board is connected for producing a signal indicating electricity consumption at the junction box receptacle with which said electricity meter is associated;
a circuit board received within said casing and electrically connected with said basic metrology board, said circuit board providing additional functionality beyond the functionality provided by said metrology board;
a common power supply received within said casing for providing power to both said basic metrology board and said circuit board;
a fixed connector extending between said basic metrology board and said circuit board, for at least partially mechanically supporting said circuit board, said fixed connector including multiple respective conductors for carrying between said basic metrology board and said circuit board both data from said respective boards and power from said common power supply;
a support chassis, defining mounting holes therein for mating with said baseplate mounting posts for support of said chassis within said casing in a predetermined relationship with said baseplate;
a meter display mounted in snap fit arrangement supported in fixed relation to said support chassis;
a coil electrically associated with said spades and physically supported in predetermined relationship to said baseplate;
a Hall Effect sensor associated with said basic metrology board and situated in a predetermined position relatively adjacent said coil for electrical sensing interaction therewith, said predetermined position being formed in part by said predetermined relationship between said baseplate and said basic metrology board; and
whereby said modular electricity meter establishes predetermined spatial relationships between selected alternative components using snap fit and interlocking arrangements established from said common baseplate.

26. A modular electricity meter as in claim 25, wherein said meter display comprises one of an electronic meter display and a mechanical based meter display.

27. A modular electricity meter as in claim 25, wherein said resilient connectors comprise a plurality of cantilevered spring connector elements, and said meter further includes weldments such that said baseplate and said basic metrology board are welded to one another in said predetermined relationship thereof.

28. A modular electricity meter as in claim 25, further including an at least partially transparent outer cover received over said inner cover for protection of components within said casing, and so that said meter display is visible therethrough.

29. A modular electricity meter as in claim 25, wherein said baseplate mounting posts are tapered, and said mounting holes of said basic metrology board and said support chassis are commonly received thereover but have respectively different sets of diameters so that said basic metrology board and said support chassis are selectively separated from one another along the axial length of said baseplate tapered mounting posts.

30. A modular electricity meter as in claim 25, further including an antenna directly incorporated into one of said basic metrology board and said circuit board for transmitting through said inner cover a radio signal indicating data from at least one of said boards.

31. A modular electricity meter as in claim 25, further including:
a light source supported on said basic metrology board and indicative of said signal therefrom; and
a light pipe supported on said support chassis and positioned relative to said basic metrology board so as to carry light from said light source to outside said casing.

32. A modular electricity meter as in claim 25, further including a main circuit supported on said baseplate and defining an initial opening therein for calibration access to said basic metrology board and said circuit board during assembly of said electricity meter.

33. A modular electricity meter as in claim 32, further including a nonremovable bridge clip received in said main circuit initial opening for providing a tamper proof circuit bridge closure to said opening.

34. A modular electricity meter as in claim 33, wherein said bridge clip further includes exposed terminals to provide continued access to said main circuit for field testing of said electricity meter after assembly thereof.

35. A modular electricity meter as in claim 25, further including additional output means for outputting data from at least one of said basic metrology board and said circuit board using at least one of hardwired transmissions, radio frequency transmissions, pulse outputs, optical link outputs, modem telephone line transmissions and wireless telephone transmissions.

36. Methodology for providing an electricity meter, comprising the steps of:
forming an encloseable casing comprising a cover and a baseplate;
including electrical connection spades situated for extending through said baseplate and outwardly therefrom, and adapted for mechanical seating thereof in a mating receptacle;
providing within said case a metrology board electrically connected to said spades and capable of producing a signal indicative of electricity consumption; and further including the steps of housing resilient connectors within said casing and situated for providing said electrical connection between said spades and said metrology board, whereby the assembly of said electricity meter and the formation of said electrical connection between said spades and said metrology board is achieved without requiring the use of individual connectors.

37. Methodology as in claim 36, further including providing respective mating posts and holes associated with said baseplate and said metrology board for mutual physical connection thereof.

38. Methodology as in claim 37, further including providing said baseplate with tapered posts and said metrology board with holes therein which are mated with said tapered posts such that said metrology board is supported on said baseplate in a predetermined position relative thereto.

39. Methodology as in claim 38, further including the step of welding said baseplate and said metrology board together so as to fix them in their relative predetermined position.

40. Methodology as in claim 38, further including:
supporting a coil within said casing electrically associated with said spades and physically supported in predetermined relationship to said baseplate; and
including a Hall Effect sensor on said metrology board positioned relatively adjacent said coil in a preselected position determined by the predetermined positioning respectively of said coil and said metrology board relative to said baseplate.

41. Methodology as in claim 37, further including:
supporting a chassis on said baseplate;
providing a light source supported on said metrology board and indicative of a signal therefrom; and
support a light pipe on said chassis and positioned to carry light from said light source to outside said cover.

42. Methodology as in claim 37, further including supporting an antenna on said metrology board and electrically associated therewith for transmitting through said cover a radio signal corresponding with electricity consumption as determined by said metrology board.

43. Methodology as in claim 37, further including:
supporting a chassis on said baseplate;
providing a circuit board within said casing designed for performing predetermined relatively higher level analysis of electricity consumption; and
electrically interconnecting between said metrology board and said circuit board a fixed connector, which also provides at least partial mechanical support of said circuit board.

44. Methodology as in claim 37, further including:
supporting a chassis on said baseplate; and
supporting one of an electronic meter display and a mechanical meter display on said chassis.

45. Methodology as in claim 36, further including supporting a main circuit on said baseplate, which circuit includes an initial opening therein for calibration access to said metrology board during assembly of said electricity meter.

46. Methodology as in claim 45, further including, after assembly of said electricity meter, inserting a nonremovable bridge clip into said circuit initial opening for providing a tamper proof circuit bridge closure to said opening.

47. Methodology as in claim 46, further including providing exposed terminals on said bridge clip to provide continued access to said main circuit for field testing of said electricity meter after assembly thereof.

48. Methodology for providing a modular electricity meter with multiple components selected form alternatives and assembled with snap fit and interlocking arrangements, comprising:
providing an encloseable casing having a common baseplate with plural mounting posts and an inner cover removably interconnected thereto;
extending a plurality of electrical connection mounting spades from said casing through said baseplate and outwardly therefrom, for mechanical seating thereof in an electricity meter junction box receptacle;
providing a basic metrology board, defining mounting holes therein for mating with said baseplate mounting posts for support of said basic metrology board within said casing in a predetermined relationship with said baseplate;
receiving a plurality of resilient connectors situated within said casing and electrically connecting between said basic metrology board and said spades so that said basic metrology board is connected for producing a sigal indicating electricity consumption at the junction box receptacle with which said electricity meter is associated;
situating a circuit board within said casing and electrically connected with said basic metrology board, said circuit board providing additional functionality beyond the functionality provided by said metrology board;
including a common power supply received within said casing for providing power to both said basic metrology board and said circuit board;
extending a fixed connector between said basic metrology board and said circuit board, for at least partially mechanically supporting said circuit board, said fixed connector including multiple respective conductors for carrying between said basic metrology board and said circuit board both data from said respective boards and power from said common power supply;
including a support chassis, defining mounting holes therein for mating with said baseplate mounting posts for support of said chassis within said casing in a predetermined relationship with said baseplate;
mounting a meter display in snap fit arrangement supported in fixed relation to said support chassis;
electrically associating a coil with said spades and physically supported in predetermined relationship to said baseplate;
associating a Hall Effect sensor with said basic metrology board and situated in a predetermined position relatively adjacent said coil for electrical sensing interaction therewith, said predetermined position being formed in part by said predetermined relationship between said baseplate and said basic metrology board; and
whereby such methodology for providing such a modular electricity meter establishes predetermined spatial relationships between selected alternative components using snap fit and interlocking arrangements established from said common baseplate.

49. Methodology for a modular electricity meter as in claim 48, wherein said meter display comprises one of an electronic meter display and a mechanical based meter display.

50. Methodology for a modular electricity meter as in claim 48, wherein said resilient connectors comprise a plurality of cantilevered spring connector elements, and said meter further includes welding said baseplate and said basic metrology board to one another in said predetermined relationship thereof.

51. Methodology for a modular electricity meter as in claim 48, including further providing an at least partially transparent outer cover received over said inner cover for protection of components within said casing, and so that said meter display is visible therethrough.

52. Methodology or a modular electricity meter as in claim 48, wherein said baseplate mounting posts are tapered, and said mounting holes of said basic metrology board and said support chassis are commonly received thereover but are provided with respectively different sets of diameters so that said basic metrology board and said support chassis are selectively separated from one another along the axial length of said baseplate tapered mounting posts.

53. Methodology for a modular electricity meter as in claim 48, including further providing an antenna directly incorporated into one of said basic metrology board and said circuit board for transmitting through said inner cover a radio signal indicating data from at least one of said boards.

54. Methodology for a modular electricity meter as in claim 48, including further providing:

a light source supported on said basic metrology board and indicative of said signal therefrom; and a light pipe supported on said support chassis and positioned relative to said basic metrology board so as to carry light from said light source to outside said casing.

55. Methodology for a modular electricity meter as in claim 48, including further providing a main circuit supported on said baseplate and defining an initial opening therein for calibration access to said basic metrology board and said circuit board during assembly of said electricity meter.

56. Methodology for a modular electricity meter as in claim 55, including further providing a nonremovable bridge clip received in said main circuit initial opening for providing a tamper proof circuit bridge closure to said opening.

57. Methodology for a modular electricity meter as in claim 56, wherein said bridge clip further includes exposed terminals to provide continued access to said main circuit for field testing of said electricity meter after assembly thereof.

58. Methodology for a modular electricity meter as in claim 48, including further providing additional output of data from at least one of said basic metrology board and said circuit board using at least one of hardwired transmissions, radio frequency transmissions, pulse outputs, optical link outputs, modem telephone line transmissions and wireless telephone transmissions.

* * * * *

UNITED STATES PATENT AND TRADEMARK OFFICE
CERTIFICATE OF CORRECTION

PATENT NO. : 6,885,185 B1
DATED : April 26, 2005
INVENTOR(S) : David N. Makinson et al.

It is certified that error appears in the above-identified patent and that said Letters Patent is hereby corrected as shown below:

Column 21,
Line 4, please delete "sigal" and replace with -- signal --.

Column 22,
Line 3, please delete "therefrom" and replace with -- therein --.
Line 3, please delete "sisals" and replace with -- signals --.

Column 23,
Line 2, please delete "snap it" and replace with -- snap fit --.
Line 9, please delete "case" and replace with -- casing --.

Column 25,
Line 5, please delete "support" and replace with -- supporting --.
Line 3, please insert -- main -- after the word "said" and before "circuit".

Column 26,
Line 21, please delete "sigal" and replace with -- signal --.

Column 27,
Line 1, please delete "or" and replace with -- for --.

Signed and Sealed this

Twenty-eighth Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,885,185 B1
DATED : April 26, 2005
INVENTOR(S) : David N. Makinson et al.

It is certified that error appears in the above-identified patent and that said Letters Patent is hereby corrected as shown below:

Column 6,
Line 32, please delete "a" after the word "exemplary".

Column 7,
Line 60, please delete "box 16" and replace with -- box 18 --.

Column 10,
Line 58, please delete "tamper evident" and replace with -- tamper-evident --.

Column 12,
Line 2, please insert the word "by" between the words "understood" and "those"; and
Line 34, delete the word "was".

Column 13,
Line 4, please insert the word "generally" before "162"; and
Line 27, please delete "-" between "present" and "FIG. 11".

Column 21,
Line 16, please delete "though" and replace with -- through --.
Line 55, please delete "sigal" and replace with -- signal --.

Column 22,
Line 8, please delete "therefrom" and replace with -- therein --.
Line 38, please delete "sisals" and replace with -- signals --.

Column 23,
Line 16, please delete "snap it" and replace with -- snap fit --.

Column 24,
Line 65, please delete "case" and replace with -- casing --.

Column 25,
Line 34, please delete "support" and replace with -- supporting --.
Line 62, please insert -- main -- after the word "said" and before "circuit".

Column 26,
Line 2, please delete "form" and replace with -- from --.
Line 21, please delete "sigal" and replace with -- signal --.

UNITED STATES PATENT AND TRADEMARK OFFICE
CERTIFICATE OF CORRECTION

PATENT NO. : 6,885,185 B1
DATED : April 26, 2005
INVENTOR(S) : David N. Makinson et al.

It is certified that error appears in the above-identified patent and that said Letters Patent is hereby corrected as shown below:

Column 27,
Line 9, please delete "or" and replace with -- for --.

Signed and Sealed this

Twelfth Day of July, 2005

JON W. DUDAS
*Director of the United States Patent and Trademark Office*